United States Patent
Takagi

(10) Patent No.: US 9,035,702 B2
(45) Date of Patent: May 19, 2015

(54) MICROWAVE SEMICONDUCTOR AMPLIFIER

(71) Applicant: Kazutaka Takagi, Kanagawa-ken (JP)

(72) Inventor: Kazutaka Takagi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 234 days.

(21) Appl. No.: 13/728,167

(22) Filed: Dec. 27, 2012

(65) Prior Publication Data

US 2013/0234794 A1 Sep. 12, 2013

(30) Foreign Application Priority Data

Mar. 8, 2012 (JP) .................................. 2012-052195
Mar. 8, 2012 (JP) .................................. 2012-052196
Mar. 8, 2012 (JP) .................................. 2012-052197

(51) Int. Cl.
*H03F 3/04* (2006.01)
*H03F 1/56* (2006.01)
(Continued)

(52) U.S. Cl.
CPC ................. *H03F 3/04* (2013.01); *H03F 1/565* (2013.01); *H03F 3/60* (2013.01); *H03F 2200/222* (2013.01); *H03F 2200/387* (2013.01); *H03F 2200/423* (2013.01); *H01L 2224/48137* (2013.01); *H01L 2224/49175* (2013.01); *H01L 2924/3011* (2013.01); *H01L 23/64* (2013.01); *H01L 23/66* (2013.01); *H01L 2223/6655* (2013.01); *H01L 2924/30107* (2013.01)

(58) Field of Classification Search
USPC ................................................ 330/302, 250
See application file for complete search history.

(56) References Cited

U.S. PATENT DOCUMENTS 4,390,851 A * 6/1983 Higgins et al. ................. 330/277
4,476,446 A * 10/1984 Blight ............................. 333/32
(Continued)

FOREIGN PATENT DOCUMENTS

EP 0 971 411 A2 1/2000
EP 0 971 411 A3 1/2000
(Continued)

OTHER PUBLICATIONS

Office Action issued Apr. 30, 2014 in European Patent Application No. 12199817.3.
(Continued)

*Primary Examiner* — Patricia T Nguyen
(74) *Attorney, Agent, or Firm* — Oblon, McClelland, Maier & Neustadt, L.L.P.

(57) ABSTRACT

A microwave semiconductor amplifier includes a semiconductor amplifier element, an input matching circuit and an output matching circuit. The semiconductor amplifying element includes an input electrode and an output electrode and has a capacitive output impedance. The input matching circuit is connected to the input electrode. The output matching circuit includes a bonding wire and a first transmission line. The bonding wire includes first and second end portions. The first end portion is connected to the output electrode. The second end portion is connected to one end portion of the first transmission line. A fundamental impedance and a second harmonic impedance seen toward the external load change toward the one end portion. The second harmonic impedance at the one end portion has an inductive reactance. The output matching circuit matches the capacitive output impedance of the semiconductor amplifying element to the fundamental impedance of the external load.

17 Claims, 18 Drawing Sheets

(51) Int. Cl.
    *H03F 3/60*    (2006.01)
    *H01L 23/64*   (2006.01)
    *H01L 23/66*   (2006.01)

(56) References Cited

U.S. PATENT DOCUMENTS

| | | | |
|---|---|---|---|
| 5,177,452 A * | 1/1993 | Honjo | 330/277 |
| 6,249,186 B1 * | 6/2001 | Ebihara et al. | 330/277 |
| 6,330,165 B1 | 12/2001 | Kohjiro et al. | |
| 7,741,907 B2 | 6/2010 | Takagi | |
| 2002/0015291 A1 | 2/2002 | Kohjiro et al. | |
| 2003/0102574 A1 | 6/2003 | Kohjiro et al. | |
| 2003/0183863 A1 | 10/2003 | Nakao et al. | |
| 2004/0145034 A1 * | 7/2004 | Fujioka et al. | 257/664 |
| 2005/0269590 A1 | 12/2005 | Kohjiro et al. | |
| 2007/0001300 A1 | 1/2007 | Kohjiro et al. | |
| 2012/0218040 A1 | 8/2012 | Takagi et al. | |
| 2012/0218045 A1 | 8/2012 | Takagi et al. | |
| 2012/0218046 A1 | 8/2012 | Takagi et al. | |

FOREIGN PATENT DOCUMENTS

| | | |
|---|---|---|
| EP | 1 351 300 A2 | 10/2003 |
| JP | 6-204764 | 7/1994 |
| JP | 2009-207060 | 9/2009 |
| JP | 2011-66782 A | 3/2011 |
| WO | WO 00/75990 A1 | 12/2000 |

OTHER PUBLICATIONS

Office Action issued on Jan. 6, 2014 in the corresponding Japanese Patent Application No. 2012-052195 (with English Translation).
Office Action issued on Jan. 6, 2014 in the corresponding Japanese Patent Application No. 2012-052196 (with English Translation).
Extended European Search Report issued Jun. 11, 2013 in Patent Application No. 12199817.3.
Office Action issued Jul. 28, 2014 in Japanese Patent Application No. 2012-052196 with English language translation.

* cited by examiner

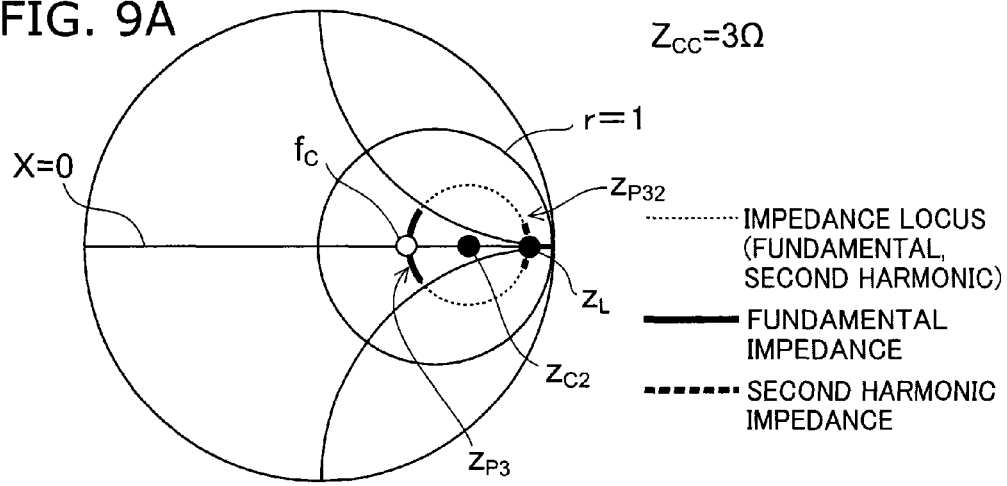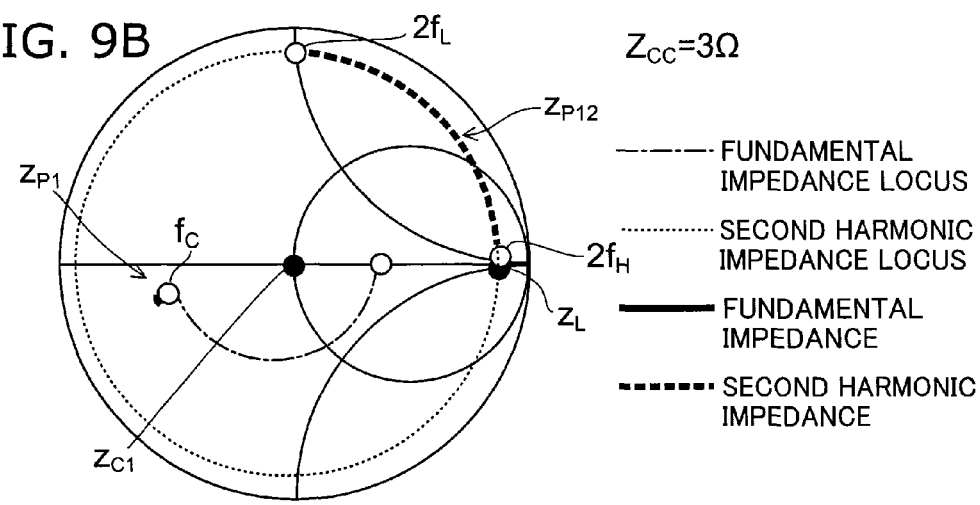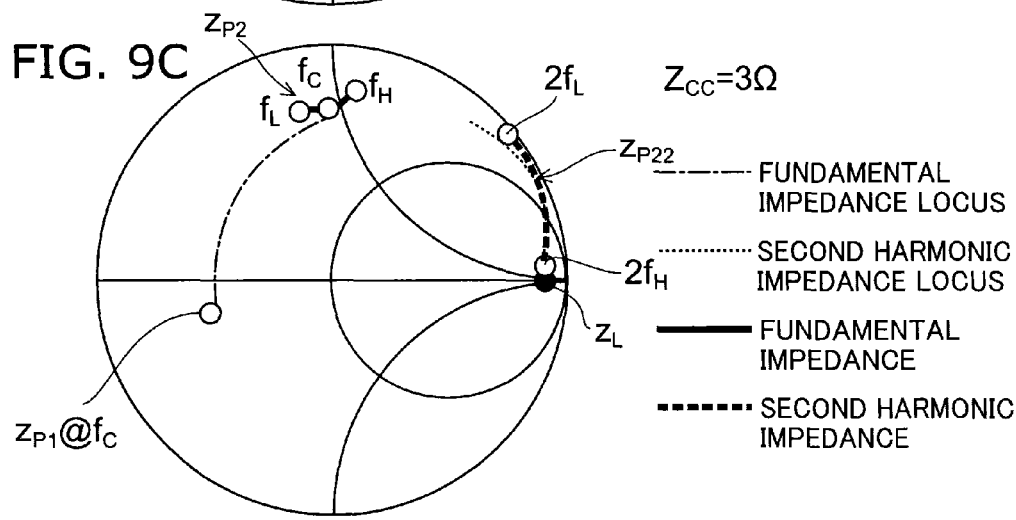

$81° \leq L2@f_C \leq 99°$
$81° \leq L3@f_C \leq 99°$
$0° < L1 \leq 90°$
$Z_{C1} < Z_{C2} < Z_{C3} < Z_L$

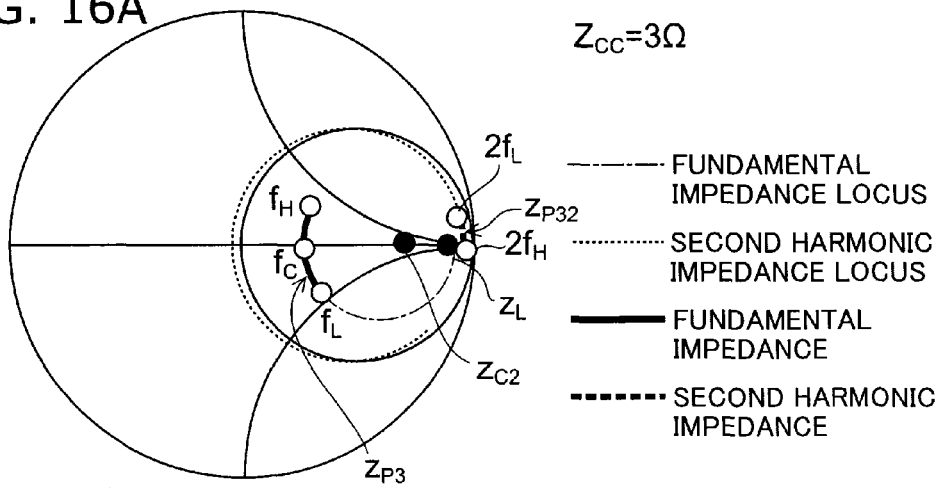
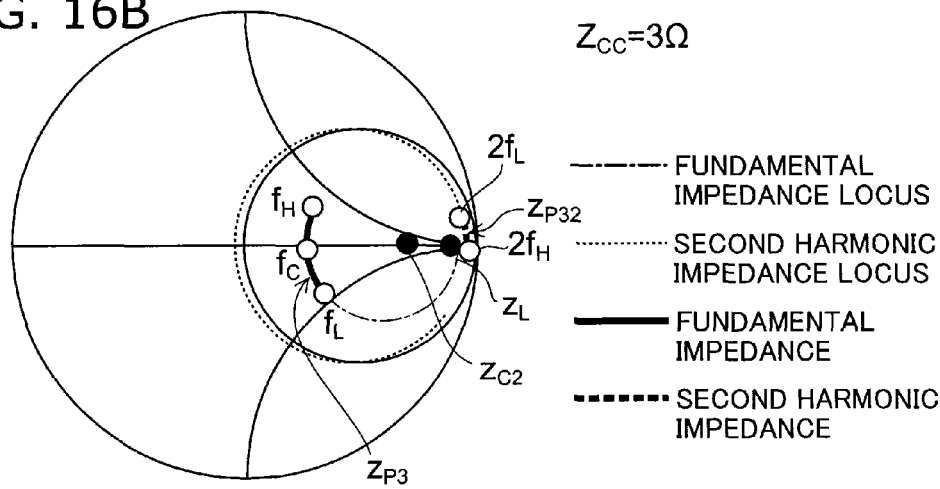
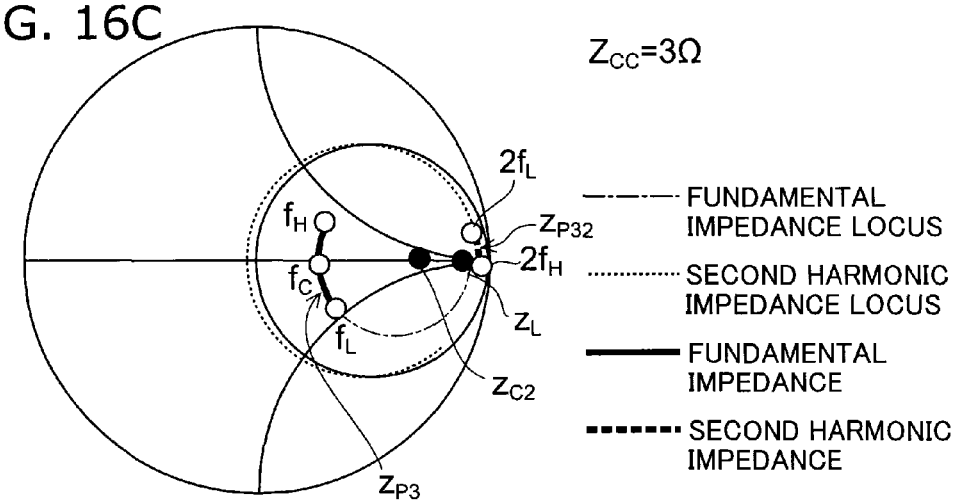

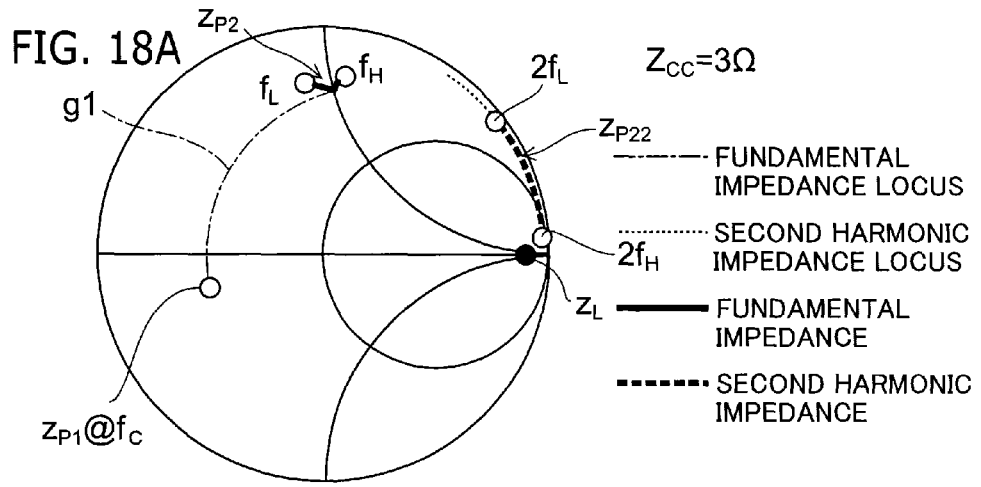
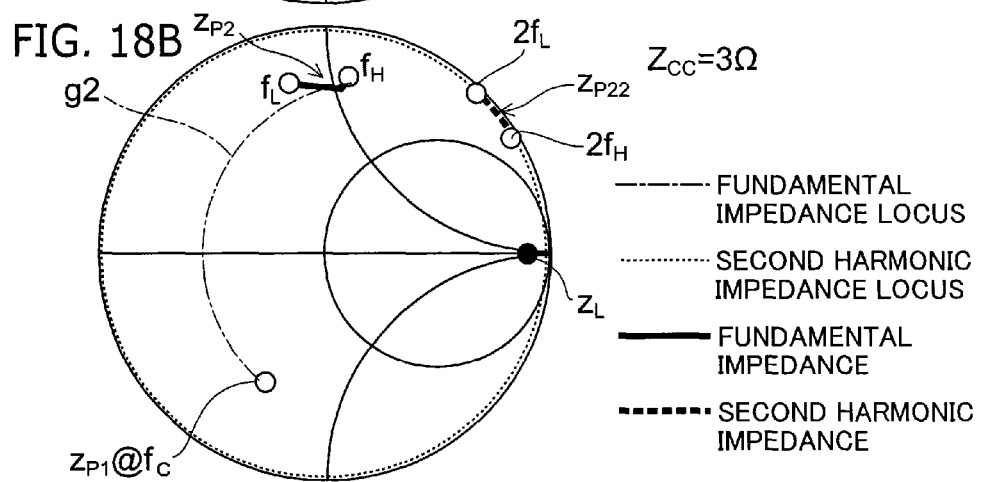
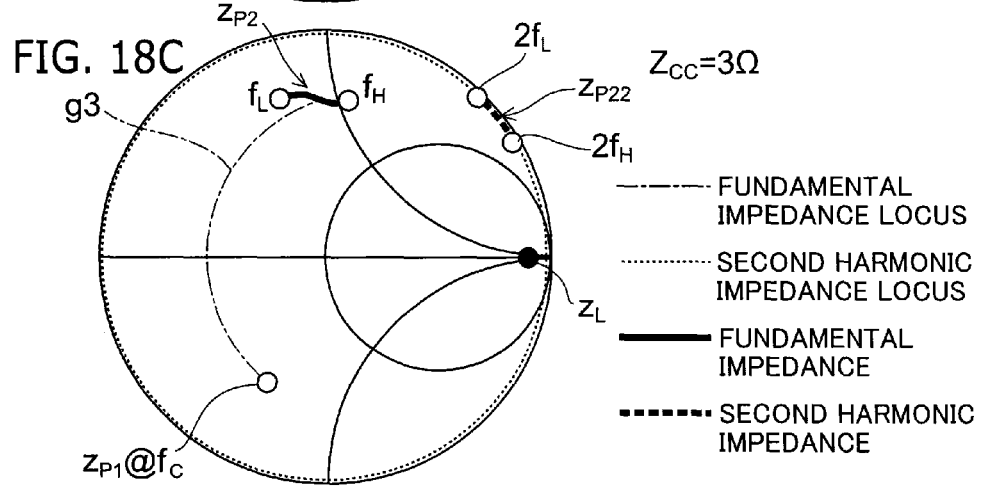



MICROWAVE SEMICONDUCTOR AMPLIFIER

CROSS-REFERENCE TO RELATIVE APPLICATIONS

This application is based upon and claims the benefit of priority from the prior Japanese Patent Application No.2012-052195, filed on Mar. 8, 2012, the prior Japanese Patent Application No.2012-052196, filed on Mar. 8, 2012 and the prior Japanese Application No. 2012-052197, filed on Mar. 8, 2012; the entire contents of which are incorporated herein by reference.

FIELD

Embodiments described herein relate generally to a microwave semiconductor amplifier.

BACKGROUND

At microwave frequencies of 1 GHz or more, amplifiers used in radio communication devices, mobile communication base stations, radar devices and the like require high power added efficiency.

The power added efficiency can be increased when the harmonic impedance seen from the output electrode of the semiconductor amplifying element toward the load is made close to the open-circuit impedance.

At microwave frequencies, the output impedance of a semiconductor amplifying element such as HEMT (high electron mobility transistor) and FET (field effect transistor) is capacitive at the fundamental. Efficiently extracting the signal amplified by the semiconductor amplifying element needs impedance matching between the output impedance of the semiconductor amplifying element and the external load at the fundamental.

Thus, for impedance matching between the semiconductor amplifying element and the external load, the impedance seen from the semiconductor amplifying element toward the load at the fundamental needs to be a desired inductive impedance. On the other hand, to increase the power added efficiency, the impedance seen from the semiconductor element toward the load at the second harmonic needs to be near the open-circuit impedance.

The impedance seen from the semiconductor amplifying element toward the load at the second harmonic can be set near the open-circuit impedance by providing a higher harmonic processing circuit using a stub near the chip. However, in this case, a matching circuit is cascaded via the higher harmonic processing circuit. This increases insertion loss and narrows the bandwidth.

BRIEF DESCRIPTION OF THE DRAWINGS

FIG. 9A is an impedance diagram seen from the third reference plane toward the load, FIG. 9B is an impedance diagram seen from the first reference plane toward the load and FIG. 9C is an impedance diagram seen from the second reference plane toward the load;

FIG. 16A is an impedance diagram in the first case, FIG. 16B is an impedance diagram in the second case and FIG. 16C is an impedance diagram in the third case;

FIG. 18A is an impedance diagram in the first case, FIG. 18B is an impedance diagram in the second case and FIG. 18C is an impedance diagram in the third case;

DETAILED DESCRIPTION

In general, according to one embodiment, a microwave semiconductor amplifier includes a semiconductor amplifying element, an input matching circuit and an output matching circuit. The semiconductor amplifying element includes an input electrode and an output electrode and has a capacitive output impedance in the frequency band. The input matching circuit is connected to the input electrode. The output matching circuit includes a bonding wire and a first transmission line. The bonding wire includes a first end portion and a second end portion on an opposite side of the first end portion. The first end portion is connected to the output electrode. The second end portion is connected to one end portion of the first transmission line. A fundamental impedance and a second harmonic impedance seen toward the external load change toward the one end portion of the first transmission line. The second harmonic impedance at the one end portion of the first transmission line has an inductive reactance within a frequency range of double a lower limit frequency of the frequency band to double an upper limit frequency of the frequency band. The output matching circuit matches the capacitive output impedance of the semiconductor amplifying element to the fundamental impedance of the external load.

Embodiments of the invention will now be described with reference to the drawings.

Figure 1:
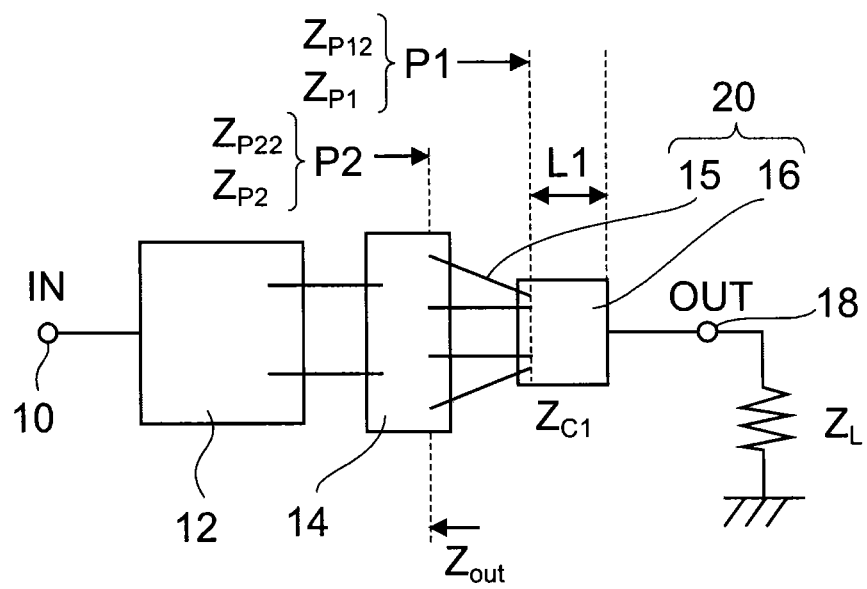
FIG. 1 is a schematic view showing the configuration of a microwave semiconductor amplifier according to a first embodiment.

FIG. 1 is a schematic view showing the configuration of a microwave semiconductor amplifier according to a first embodiment.

The microwave semiconductor amplifier includes an input terminal 10, an input matching circuit 12, a semiconductor amplifying element 14, an output matching circuit 20, and an output terminal 18. For instance, the microwave semiconductor amplifier is housed in a package. Here, the DC circuit for supplying voltage to the semiconductor amplifying element 14 is not shown. It is assumed that as seen from the output terminal 18, the external load is $Z_L$ ($\Omega$). Here, $Z_L$ can be set to e.g. 50$\Omega$.

The input matching circuit 12 is a matching circuit for the input impedance of the semiconductor amplifying element 14.

The semiconductor amplifying element 14 can be e.g. a GaAs FET, GaAs HEMT (high electron mobility transistor), or GaN HEMT. For instance, use of a GaN HEMT based on a wide bandgap material can increase the breakdown voltage and obtain high output in the wavelength range from microwaves to millimeter waves.

When the harmonic impedance seen from the output electrode (not shown) of the semiconductor amplifying element 14 toward the load is made sufficiently high, operation at high power added efficiency can be achieved. That is, the output matching circuit 20 matches the output impedance of the semiconductor amplifying element 14 at the fundamental while maintaining high impedance for harmonics. The first embodiment includes an output matching circuit 20 for increasing impedance for the second harmonic among the harmonics. Here, the output impedance $Z_{out}$ of the semiconductor amplifying element 14 can be determined by e.g. measuring the impedance during operation.

In the configuration of FIG. 1, the external load $Z_L$ is connected to the output terminal 18 of the output matching circuit 20. In the first embodiment, the output matching circuit 20 includes a bonding wire 15 and a first impedance converting circuit 16. The first impedance converting circuit 16 made of a first transmission line can be e.g. a microstrip line with characteristic impedance $Z_{C1}$ and electrical length L1.

The electrical length L can be determined by the following equation. Here, in FIG. 1, a first reference plane P1 is defined as the position bonded by a wire from the output electrode of the semiconductor amplifying element 14. Thus, the effective length M of the transmission line is slightly shorter than the physical length of the first impedance converting circuit 16.

$$L=360°\times M/\lambda\text{eff}$$

where

M: effective length of transmission line $\lambda$eff: effective wavelength at prescribed frequency The output electrode of the semiconductor amplifying element 14 is connected to the first impedance converting circuit 16 by the bonding wire 15. The first reference plane P1 for seeing the impedance toward the load is defined as the bonding position on the line pattern of the first impedance converting circuit 16. The second reference plane P2 for seeing the impedance toward the load is defined as the bonding position on the output electrode of the semiconductor amplifying element 14.

Figure 2A:
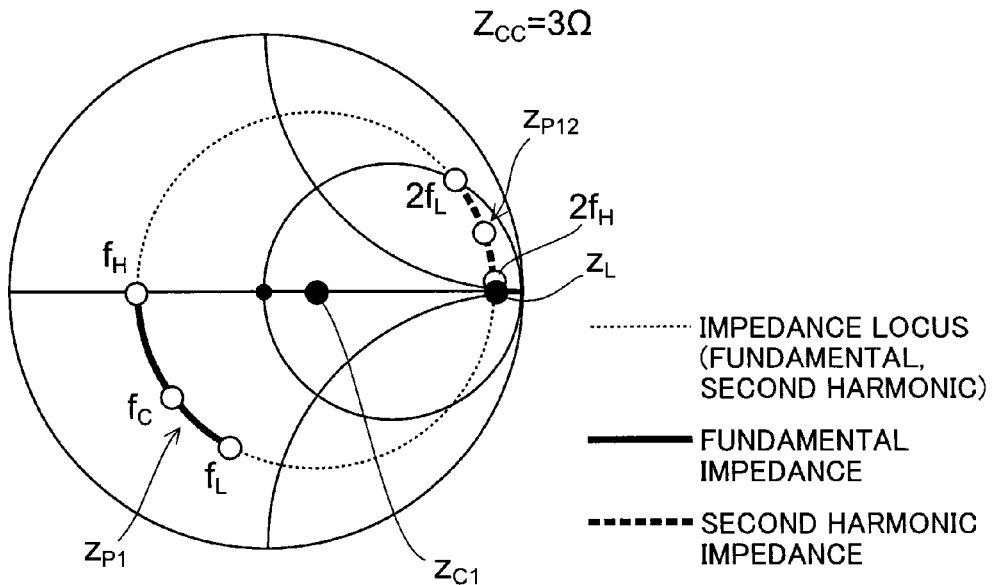
FIG. 2A is an impedance diagram seen from the first reference plane toward the load and FIG. 2B is an impedance diagram seen from the second reference plane toward the load.
Figure 2B:
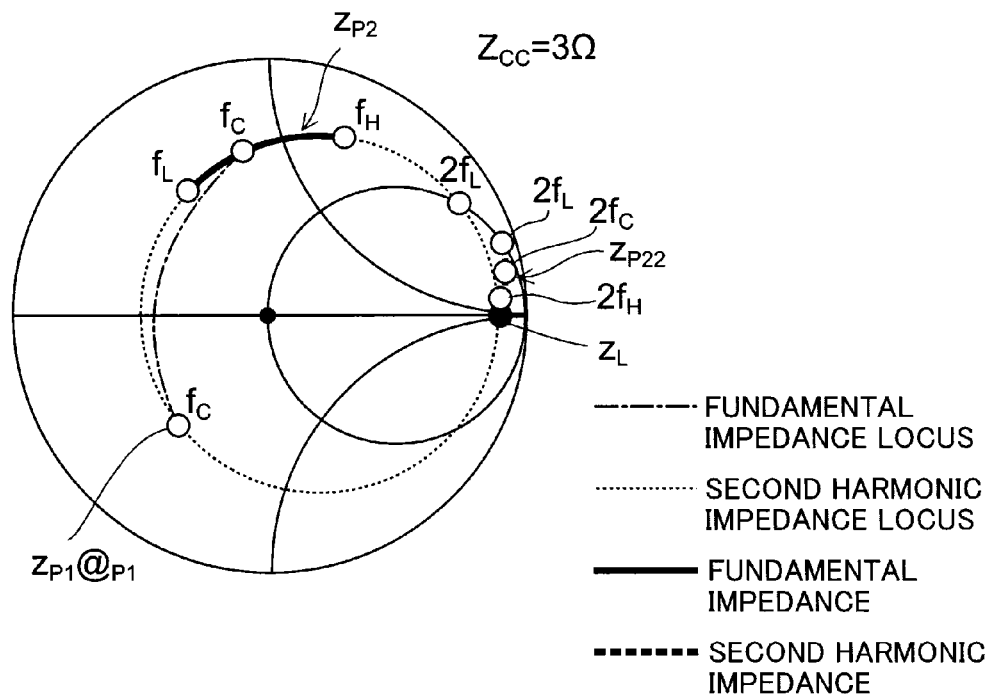

FIG. 2A is an impedance diagram seen from the first reference plane toward the load. FIG. 2B is an impedance diagram seen from the second reference plane toward the load.

In the specification, it is assumed that the Smith chart represents normalized impedance with the characteristic impedance $Z_{CC}$ set to 3$\Omega$. That is, the normalized impedance z for impedance Z (=R+jX) is represented by the following equation.

$$z=Z/Z_{CC}=(R+jX)/Z_{CC}=r+jx$$

As shown in FIG. 2A, on the impedance diagram, the load impedance is denoted by $z_L$, and the characteristic impedance of the first impedance converting circuit 16 is denoted by $z_{C1}$.

The fundamental impedance and the second harmonic impedance seen toward the load draw a clockwise impedance locus along the dotted line as the distance from the load increases. Thus, in the frequency band from $f_L$ (lower limit) to $f_H$ (upper limit), as shown in FIG. 2A, at $f_H$ (upper limit), the fundamental impedance $z_{P1}$ seen from the first reference plane P1 toward the load is converted to the neighborhood of the real axis (x=0) having the same resistance as the output impedance of the semiconductor amplifying element. Furthermore, from $f_L$ (lower limit) to $f_H$ (upper limit), the fundamental impedance $z_{P1}$ is capacitive. In the first embodiment, it is assumed that the second harmonic impedance $z_{P12}$ is inductive within a frequency range of double a lower limit frequency of the frequency band to double an upper limit frequency of the frequency band.

Furthermore, in FIG. 2B, the inductance of the bonding wire 15 is added. Then, the fundamental impedance $z_{P2}$ seen toward the load at frequency f is the sum of the fundamental impedance $z_{P1}$ at the first reference plane P1 and a reactance of $2\pi f\times Lw/Z_{CC}$ resulting from the inductance Lw of the bonding wire 15. Thus, while shifted to being inductive, the fundamental impedance $z_{P2}$ can be matched to the output impedance $z_{out}$ of the semiconductor amplifying element 14.

The fundamental impedance $z_{P2}$ seen toward the load is given by $z_{P2}=z_{out}{}^*$ (* represents complex conjugate). $z_{out}$ depends on the semiconductor amplifying element 14. Thus, by appropriately selecting the characteristic impedance $Z_{C1}$ and the electrical length L1, the fundamental impedance $z_{P2}$ can be made close to the output impedance $z_{out}{}^*$.

In this case, the second harmonic impedance $z_{P22}$ is the sum of the second harmonic impedance $z_{P12}$ kept inductive at the first reference plane P1 and a reactance of $4\pi f\times Lw/Z_{CC}$. Thus, the second harmonic impedance $z_{P22}$ can be made closer to the open-circuit impedance (infinite impedance). Here, the effect of suppressing the second harmonic depends on the first electrical length L1 of the first transmission line. In the first embodiment, more preferably, the first electrical length L1 is larger than 0 degrees and 90 degrees or less at the upper limit frequency $f_H$ of the frequency band, because the circuit can then be downsized. In FIG. 2A, the first electrical length L1 is generally 90 degrees at the upper limit frequency $f_H$.

The second harmonic impedance seen toward the load can be made close to the open-circuit impedance also by providing a stub circuit near the semiconductor amplifying element 14. However, this increases insertion loss. Furthermore, the fundamental impedance is made lower than at the chip end surface of the semiconductor amplifying element. This may make it difficult to match the fundamental impedance over a wide bandwidth. In contrast, the first embodiment allows wide-band matching while suppressing the increase of insertion loss. If the portion of the second harmonic impedance on the upper limit frequency side exceeds the inductive reactance region into the capacitive reactance region, the portion of the second harmonic impedance on the upper limit frequency side at the second reference plane P2, including the reactance resulting from the inductance Lw of the bonding wire 15, moves away from the infinite impedance toward the low impedance side. This decreases the effect of suppressing the second harmonic, and is undesirable.

Figure 3:
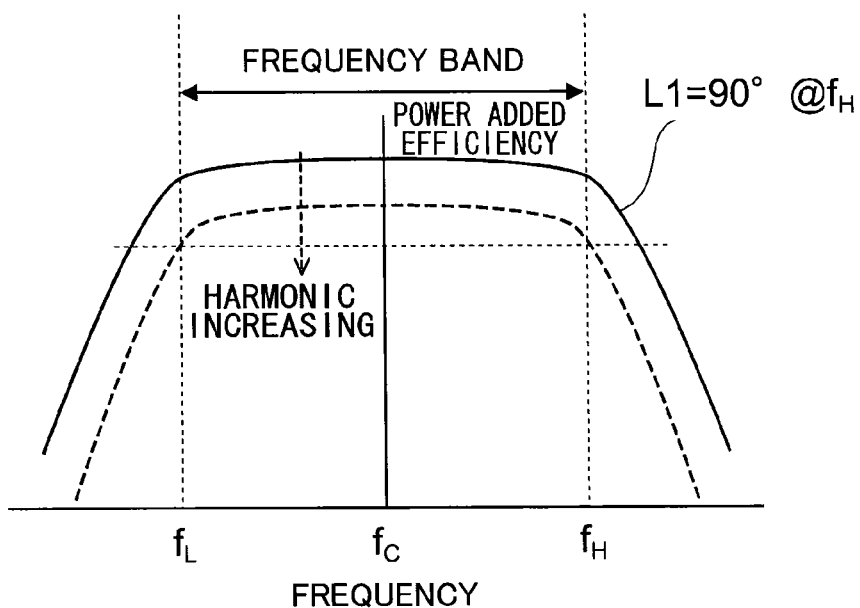
FIG. 3 is a graph describing the power added efficiency of the microwave semiconductor amplifier according to the first embodiment.

FIG. 3 is a graph describing the power added efficiency of the microwave semiconductor amplifier according to the first embodiment.

The center frequency of the frequency band is e.g. in the range of 1-20 GHz. The output matching circuit 20 is matched with the fundamental and has a high impedance close to the open-circuit impedance for the second harmonic. Then, high power added efficiency can be achieved in the available frequency band between the lower limit frequency $f_L$ and the upper limit frequency $f_H$ of the frequency band. Furthermore, for instance, the lower limit frequency $f_L$ can be set to $0.9f_C$, and the upper limit frequency $f_H$ can be set to $1.1f_C$.

As the second harmonic impedance moves away from the open-circuit impedance, the second harmonic component may fail to be reflected to the semiconductor amplifying element and leak to the external load. Then, the second harmonic component increases, and the power added efficiency decreases as shown by the dashed line.

Figure 4:
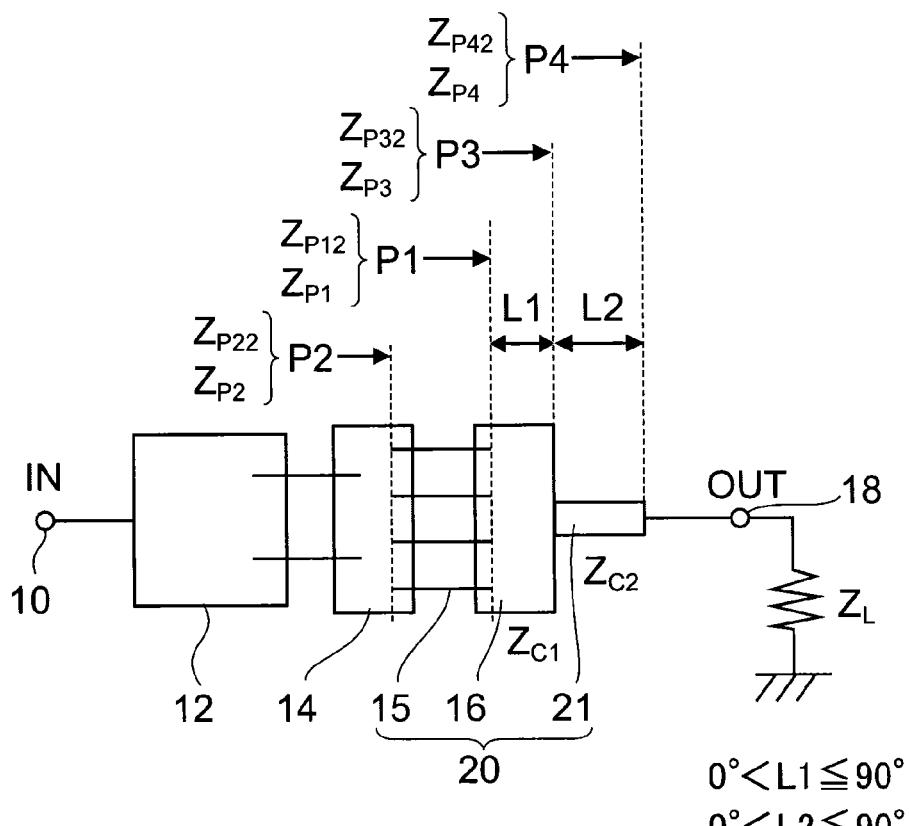
FIG. 4 is a schematic view showing the configuration of a microwave frequency semiconductor amplifying circuit according to a second embodiment.

FIG. 4 is a schematic view showing the configuration of a microwave semiconductor amplifying circuit according to a second embodiment.

The output matching circuit 20 of the second embodiment includes a bonding wire 15, a first impedance converting circuit 16, and a second impedance converting circuit 21 made of a second transmission line. The second impedance converting circuit 21 has a characteristic impedance $Z_{C2}$ ($Z_{C1} < Z_{C2} < Z_L$) and an electrical length L2 of larger than 0 degrees and 90 degrees or less.

Figure 5A:
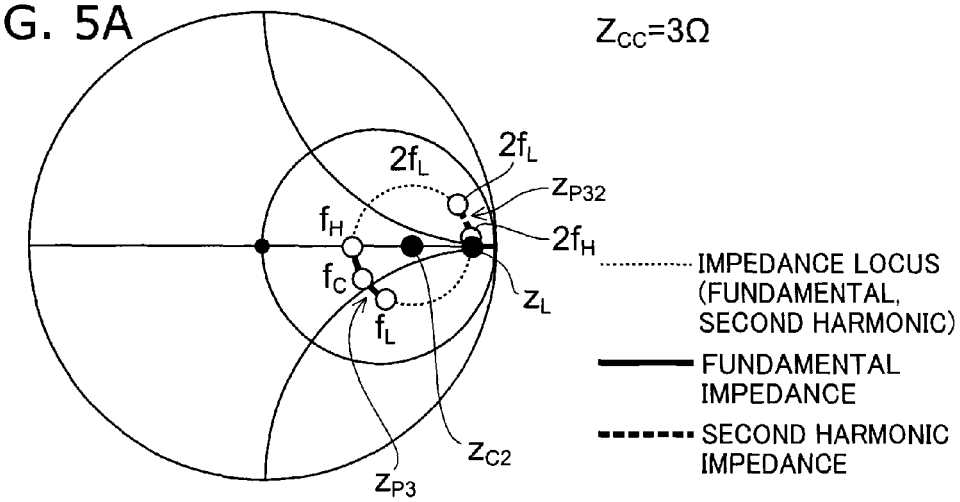
FIG. 5A is an impedance diagram seen from the third reference plane toward the load.
Figure 5B:
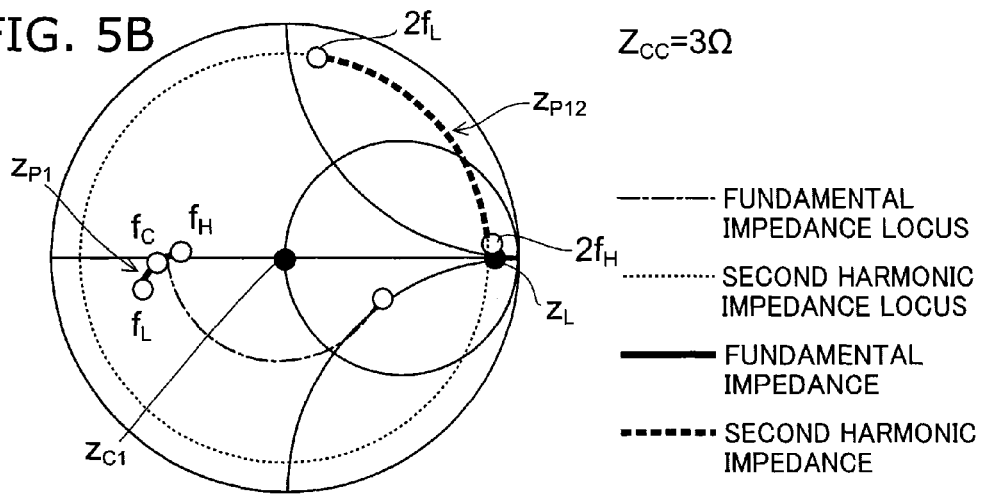
FIG. 5B is an impedance diagram seen from the first reference plane and FIG. 5C is an impedance diagram seen from the second reference plane.
Figure 5C:
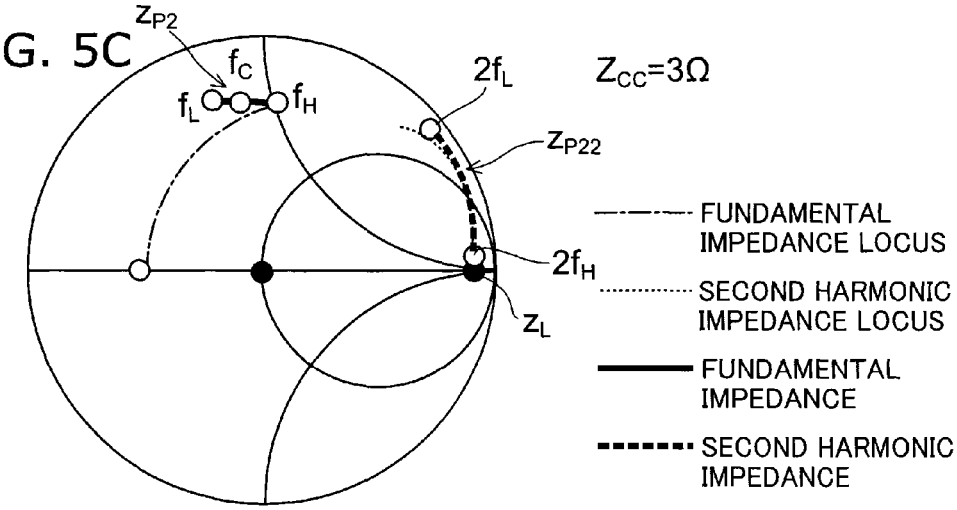

FIG. 5A is an impedance diagram seen from the third reference plane toward the load. FIG. 5B is an impedance diagram seen from the first reference plane. FIG. 5C is an impedance diagram seen from the second reference plane. In FIG. 5A, the characteristic impedance $Z_{C2}$ of the second impedance converting circuit 21 can be made higher than the characteristic impedance of the first impedance converting circuit 16 in the first embodiment.

In FIG. 5B, the characteristic impedance $Z_{C1}$ ($Z_{C1} < Z_{C2} < Z_L$) of the first impedance converting circuit 16 can be set lower than the characteristic impedance of the first impedance converting circuit 16 in the first embodiment. The fundamental impedance $z_{P1}$ seen from the first reference plane P1 toward the load is converted to the neighborhood of the real axis (x=0) having the same resistance as the output impedance of the semiconductor amplifying element 14. The second harmonic impedance $z_{P12}$ is maintained to be inductive.

Thus, impedance converting circuits in multiple stages are used. Accordingly, as shown in FIG. 5C, the fundamental impedance $z_{P2}$ seen from the second reference plane P2 toward the load, with the inductance of the bonding wire 15 added thereto, has a narrower variation range of the impedance locus in the frequency band $f_L$-$f_H$. This facilitates matching to the output impedance $z_{out}$ of the semiconductor amplifying element 14. Thus, the frequency characteristics of gain can be made flatter. Also in the case of using impedance converting circuits in multiple stages, the second harmonic impedance $z_{P12}$ seen from the first reference plane P1 toward the load is maintained to be inductive. Thus, the second harmonic impedance $z_{P22}$ can be made closer to the open-circuit impedance because the inductance of the bonding wire 15 is added thereto. Accordingly, the power added efficiency can be made higher.

The effect of suppressing the second harmonic depends on the electrical length L1 of the first transmission line and the electrical length L2 of the second transmission line. TABLE 1 shows an example of the dependence.

TABLE 1

| | L & Γ | | | | |
| --- | --- | --- | --- | --- | --- |
| CASE | L2@$f_L$ | Γ for f @P3 | Γ for 2f @P3 | L1@$f_L$ | Γ for 2f @P2 |
| 1st | 73° | 0.56 or less | 0.84 or more | 73° | 0.9 or more |
| 2nd | 60° | 0.71 or less | 0.71 or more | 69° | 0.9 or more |
| 3rd | 36° | 0.81 or less | 0.37 or more | 72° | 0.58 |

For each case, TABLE 1 shows the second electrical length L2 at the lower limit frequency $f_L$, the reflection coefficient Γ for the fundamental (f) at the third reference plane P3, the reflection coefficient Γ for the second harmonic (2f) at the third reference plane P3, the first electrical length L1, and the reflection coefficient Γ for the second harmonic (2f) at the second reference plane P2.

In the first case, at the upper limit frequency $f_H$, the second electrical length L2 is 90 degrees, and the first electrical length L1 is 90 degrees. Here, it is assumed that the relative bandwidth is 20%. Then, at the lower limit frequency $f_L$, the second electrical length L2 is 73 degrees, and the first electrical length L1 is 73 degrees. At the third reference plane P3, the reflection coefficient Γ for the fundamental is 0.56 or less, and the reflection coefficient Γ for the second harmonic is 0.84 or more. Thus, the reflection coefficient Γ for the second harmonic is sufficiently larger than the reflection coefficient Γ for the fundamental. At the second reference plane P2, the reflection coefficient Γ for the second harmonic is 0.9 or more, which achieves a high reflection level. This indicates that the impedance seen from the semiconductor amplifying element 14 is close to the open-circuit impedance.

In the second case, at the upper limit frequency $f_H$, the second electrical length L2 is 74 degrees, and the first electrical length L1 is 85 degrees. Here, it is assumed that the relative bandwidth is 20%. Then, at the lower limit frequency $f_L$, the second electrical length L2 is 60 degrees, and the first electrical length L1 is 69 degrees. At the third reference plane P3, the reflection coefficient Γ for the fundamental is 0.71 or less, and the reflection coefficient Γ for the second harmonic is 0.71 or more. Thus, the reflection coefficient for the second harmonic is equal to the reflection coefficient for the fundamental. At the second reference plane P2, the reflection coefficient Γ for the second harmonic is 0.9 or more, which achieves a high reflection level. This indicates that the impedance seen from the semiconductor amplifying element 14 is close to the open-circuit impedance.

In the third case, at the upper limit frequency $f_H$, the second electrical length L2 is 44 degrees, and the first electrical length L1 is 88 degrees. Here, it is assumed that the relative bandwidth is 20%. Then, at the lower limit frequency $f_L$, the second electrical length L2 is 36 degrees, and the first electrical length L1 is 72 degrees. At the third reference plane P3, the reflection coefficient Γ for the fundamental is 0.81 or less, and the reflection coefficient Γ for the second harmonic is approximately 0.37 or more. Thus, the reflection coefficient for the second harmonic is smaller than the reflection coefficient for the fundamental. At the second reference plane P2, the reflection coefficient Γ for the second harmonic decreases to approximately 0.58.

At the third reference plane P3, in the second case, the maximum reflection coefficient Γ for the fundamental in the band is generally equal to the minimum reflection coefficient for the second harmonic in the band. In contrast, in the third case, the reflection coefficient Γ for the second harmonic is smaller than the reflection coefficient Γ for the fundamental. That is, in the third case, suppression of the second harmonic is insufficient. The second case in which the second electrical length L2 at the lower limit frequency $f_L$ is 60 degrees or more is more preferable, and the first case is even more preferable. The reflection coefficient once decreased is difficult to increase. Thus, preferably, the reflection coefficient Γ for the second harmonic is always kept large.

Figure 6:
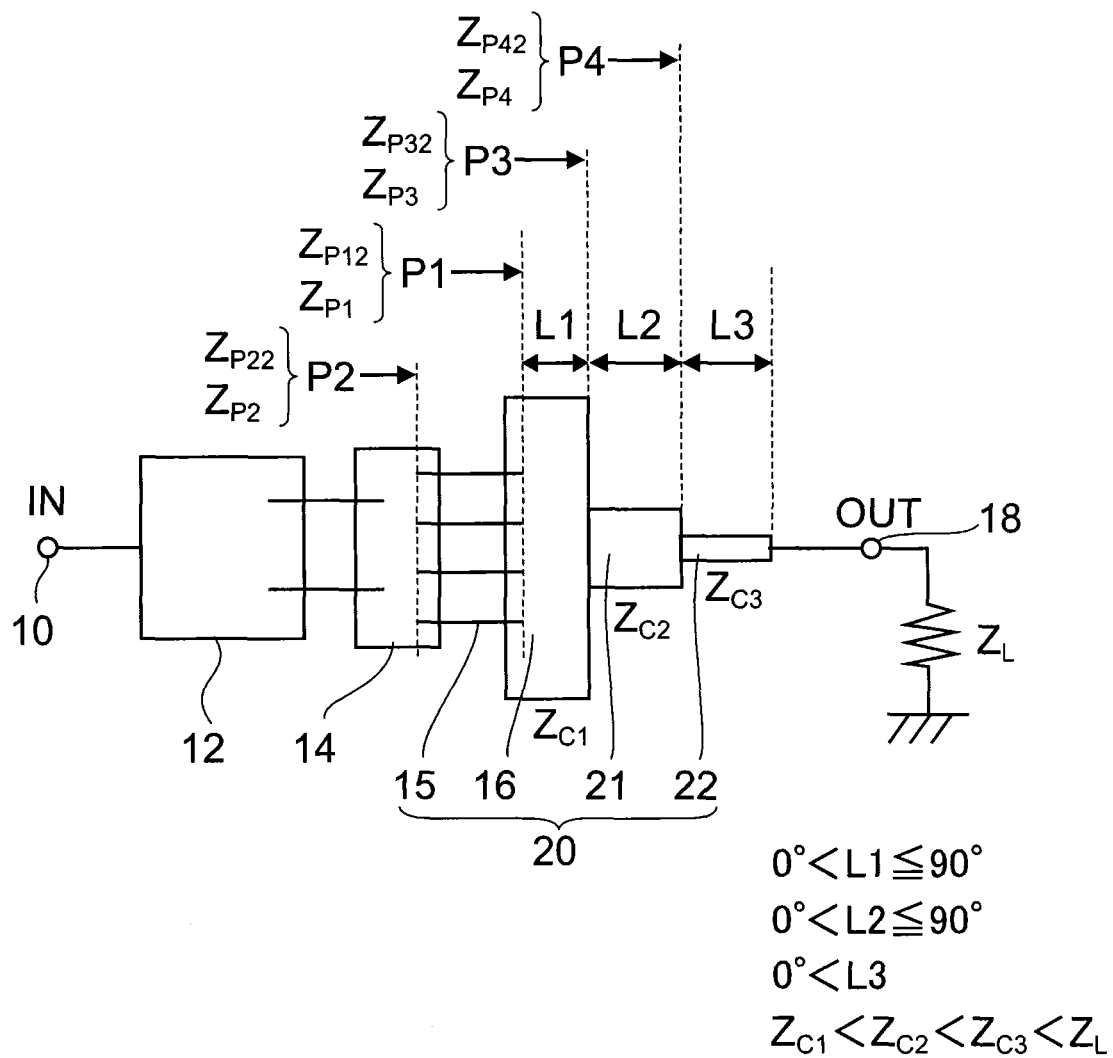
FIG. 6 is a schematic view showing the configuration of a microwave semiconductor amplifier according to a third embodiment.

FIG. 6 is a schematic view showing the configuration of a microwave semiconductor amplifier according to a third embodiment.

The output matching circuit 20 of the third embodiment includes a bonding wire 15, a first impedance converting circuit 16, a second impedance converting circuit 21, and a third impedance converting circuit 22 made of a third transmission line. The third impedance converting circuit 22 has a characteristic impedance $Z_{C3}$ ($Z_{C1}<Z_{C2}<Z_{C3}<Z_L$) and an electrical length L3 of larger than 0 degrees.

Figure 7:
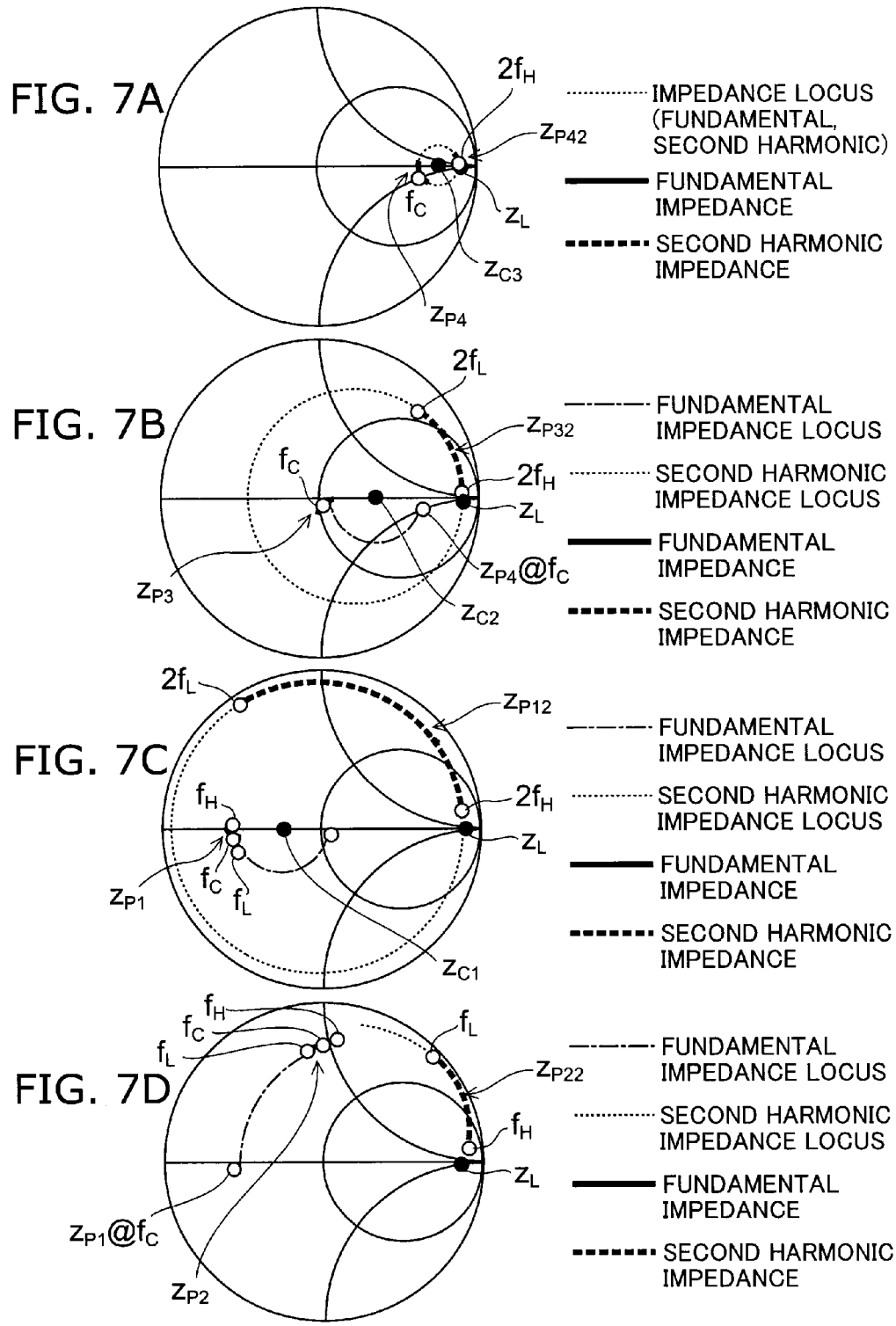
FIG. 7A is an impedance diagram seen from the fourth reference plane toward the load.
FIG. 7B is an impedance diagram seen from the third reference plane.
FIG. 7C is an impedance diagram seen from the first reference plane and FIG. 7D is an impedance diagram seen from the second reference plane.

FIG. 7A is an impedance diagram seen from the fourth reference plane toward the load. FIG. 7B is an impedance diagram seen from the third reference plane. FIG. 7C is an impedance diagram seen from the first reference plane. FIG. 7D is an impedance diagram seen from the second reference plane.

In FIG. 7B, the fundamental impedance $Z_{P3}$ seen from the third reference plane P3 toward the load is converted to the neighborhood of the center of the impedance diagram. The second harmonic impedance $z_{P32}$ is maintained to be inductive.

In FIG. 7C, the fundamental impedance $Z_{P1}$ seen from the first reference plane P1 toward the load can be set near the real axis (x=0) having the same resistance as the output impedance of the semiconductor amplifying element 14. The second harmonic impedance $z_{P12}$ is maintained to be inductive.

Thus, impedance converting circuits in multiple stages are used. Accordingly, as shown in FIG. 7D, the fundamental impedance $Z_{P2}$ seen from the second reference plane P2 toward the load, with the inductance of the bonding wire 15 added thereto, has a narrower variation range of the impedance locus in the frequency band $f_L$-$f_H$. This facilitates matching with the output impedance $z_{out}$ of the amplifying element 14. Thus, the frequency characteristics of gain can be made flatter. Also in the case of using impedance converting circuits in multiple stages, the second harmonic impedance $z_{P12}$ seen from the first reference plane P1 toward the load is maintained to be inductive. Thus, the second harmonic impedance $z_{P22}$ can be made closer to the open-circuit impedance because the inductance of the bonding wire 15 is added thereto. Accordingly, the power added efficiency can be made higher. Also in the third embodiment, as in the second embodiment, more preferably, the electrical length L3 of the third impedance converting circuit 22 on the output terminal 18 side is set to 60 degrees or more at the lower limit frequency $f_L$.

Figure 8:
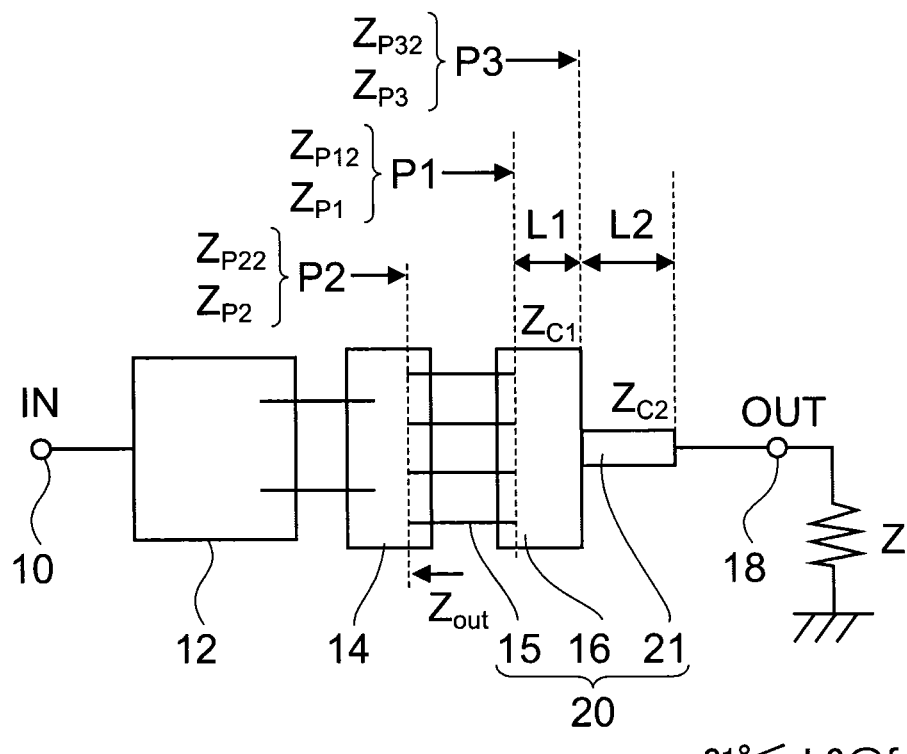
FIG. 8 is a schematic view showing the configuration of a microwave semiconductor amplifier according to a fourth embodiment.

FIG. 8 is a schematic view showing the configuration of a microwave semiconductor amplifier according to a fourth embodiment.

In the fourth embodiment, the output matching circuit 20 includes a bonding wire 15, a first impedance converting circuit 16 made of a first transmission line, and a second impedance converting circuit 21 made of a second transmission line. The first impedance converting circuit 16 can be e.g. a microstrip line with characteristic impedance $Z_{C1}$ and electrical length L1.

The electrical length L2 of the second impedance converting circuit 21 is set to a length corresponding to a quarter-wave transformer at the center frequency $f_C$ of the band of the amplifier. In this description, the "electrical length of a quarter-wave transformer" includes the range of ±10% for 90°. That is, the "electrical length of a quarter-wave transformer" is in the range of 81° or more and 99° or less. Then, the second impedance converting circuit 21 substantially acts as a quarter-wave impedance transformer. Furthermore, the characteristic impedance $Z_{C2}$ is higher than the characteristic impedance $Z_{C1}$ and lower than the load impedance $Z_L$.

The output electrode of the semiconductor amplifying element 14 is connected to the first impedance converting circuit 16 by the bonding wire 15. The second reference plane P2 for seeing the impedance toward the load is defined as the bonding position on the output electrode of the semiconductor amplifying element 14.

FIG. 9A is an impedance diagram seen from the third reference plane toward the load. FIG. 9B is an impedance diagram seen from the first reference plane toward the load. FIG. 9C is an impedance diagram seen from the second reference plane toward the load.

As shown in FIG. 9A, on the impedance diagram, the load impedance is denoted by $z_L$, and the characteristic impedance of the first impedance converting circuit 16 is denoted by $z_{C1}$.

The impedance seen from the third reference plane P3 toward the load draws a clockwise impedance locus along the dotted line with the distance from the load, and is converted to a low impedance. In the fourth embodiment, the second impedance converting circuit 21 acts as a quarter-wave transformer for the fundamental. That is, at the center frequency $f_C$, the fundamental impedance $Z_{P3}$ consists only of the resistance component, and its resistance $r_{P3}$ (normalized impedance) is represented by the following equation.

$$r_{P3}=z_{C2}^2/L_L$$

Thus, in the frequency band $f_L$-$f_H$, as shown in FIG. 9A, the fundamental impedance $z_{P3}$ seen from the third reference plane P3 toward the load crosses the real axis (x=0) and is converted to the neighborhood of the real axis (x=0) having the same resistance as the output impedance of the semiconductor amplifying element 14. Furthermore, the second harmonic impedance $z_{P32}$ also crosses the real axis (x=0), and becomes capacitive particularly on the high side of the frequency band. Use of a quarter-wave transformer enables the fundamental impedance $z_{P3}$ to consist only of the resistance component at the center frequency $f_C$. This facilitates designing the output matching circuit 20.

In FIG. 9B, the electrical length L1 of the first impedance converting circuit 16 is set to 0 degrees or more and 90 degrees or less so that the second harmonic impedance at the upper limit frequency $f_H$ seen from the first reference plane P1 toward the load is maintained to be inductive. Thus, at the center frequency $f_C$, the fundamental impedance $z_{P1}$ is capacitive.

FIG. 9C shows an impedance seen from the second reference plane P2 toward the load with the inductive reactance of the bonding wire 15 added thereto. The fundamental impedance $z_{P2}$ at frequency f is the sum of the impedance $z_{P1}$ seen from the first reference plane P1 toward the load and a reactance of $2\pi f \times Lw/Z_{CC}$ resulting from the inductance Lw of the bonding wire 15. Thus, while shifted to being inductive, the fundamental impedance $z_{P2}$ can be matched with the output impedance $z_{out}$ of the semiconductor amplifying element 14.

As shown in FIG. 9C, the electrical length L2 of the second impedance converting circuit 21 is set to a length corresponding to a quarter-wave transformer at the center frequency $f_C$ of the band of the amplifier. Thus, the fundamental impedance $z_{P2}$ has a narrow locus region in the band and facilitates achieving a wide bandwidth. In this case, the second harmonic impedance $z_{P22}$ is the sum of the second harmonic impedance $z_{P12}$ kept inductive at the first reference plane P1 and a reactance of $4\pi f \times Lw/Z_{CC}$. Thus, the second harmonic impedance $z_{P22}$ is made closer to the open-circuit impedance. Accordingly, the second harmonic can be confined in the semiconductor amplifying element 14 to increase the power added efficiency.

TABLE 2 shows an example of the characteristic impedance and electrical length of the transmission line constituting the first impedance converting circuit 16 and the second impedance converting circuit 21

TABLE 2

| CASE | L & Γ | | | | |
| --- | --- | --- | --- | --- | --- |
| | L2@$f_C$ | $Z_{C2}$ | L1@$f_H$ | $Z_{C1}$ | Γ for 2f @P2 |
| 1st | 90° | 18Ω | 90° | 2.4Ω | 0.89 or more |
| 2nd | 90° | 18Ω | 22° | 1.0Ω | 0.99 or more |
| 3rd | 90° | 18Ω | 16° | 0.7Ω | 0.99 or more |

According to the simulation of TABLE 2, in the first case, the characteristic impedance $Z_{C2}$ of the transmission line constituting the second impedance converting circuit 21 is set to 18Ω, and its electrical length L2 is set to 90 degrees at the center frequency $f_C$. The characteristic impedance $Z_{C1}$ of the transmission line constituting the first impedance converting circuit 16 is 2.4Ω, and its electrical length L1 at the upper limit frequency $f_H$ is 90 degrees.

In the second case, the second impedance converting circuit 21 is made identical to that of the first case. However, the characteristic impedance $Z_{C1}$ of the transmission line constituting the first impedance converting circuit 16 is 1.0Ω, and its electrical length L1 at the upper limit frequency $f_H$ is 22 degrees.

In the third case, the second impedance converting circuit 21 is made identical to that of the first case. However, the characteristic impedance $Z_{C1}$ of the transmission line constituting the first impedance converting circuit 16 is 0.7Ω, and its electrical length L1 at the upper limit frequency $f_H$ is 16 degrees.

In the second case, matching at the fundamental can be achieved by decreasing the characteristic impedance $Z_{C1}$ of the first impedance converting circuit 16 and increasing the inductance Lw of the bonding wire 15 by the decreased amount of the first electrical length L1. By increasing the inductance Lw, the reflection coefficient for the second harmonic (2f) at the second reference plane P2 can be increased to 0.89 or more. However, there is a lower limit to the feasible characteristic impedance.

Figure 10:
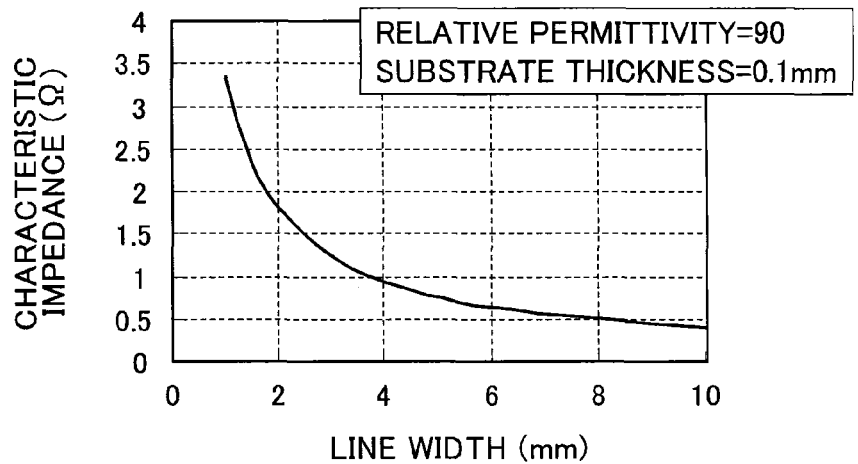
FIG. 10 is a graph showing the dependence of characteristic impedance on transmission line width.

FIG. 10 is a graph showing the dependence of characteristic impedance on transmission line width.

The vertical axis represents characteristic impedance (Ω), and the horizontal axis represents line width (mm). Here, the substrate constituting the microstrip line has a relative permittivity of 90 and a substrate thickness of 0.1 mm. In view of implementability, the line width is preferably 4 mm or less. That is, the lower limit of the characteristic impedance is 1Ω, as shown in TABLE 2. As a result, the electrical length L1 of the first impedance converting circuit 16 is preferably 22 degrees or more.

Figure 11:
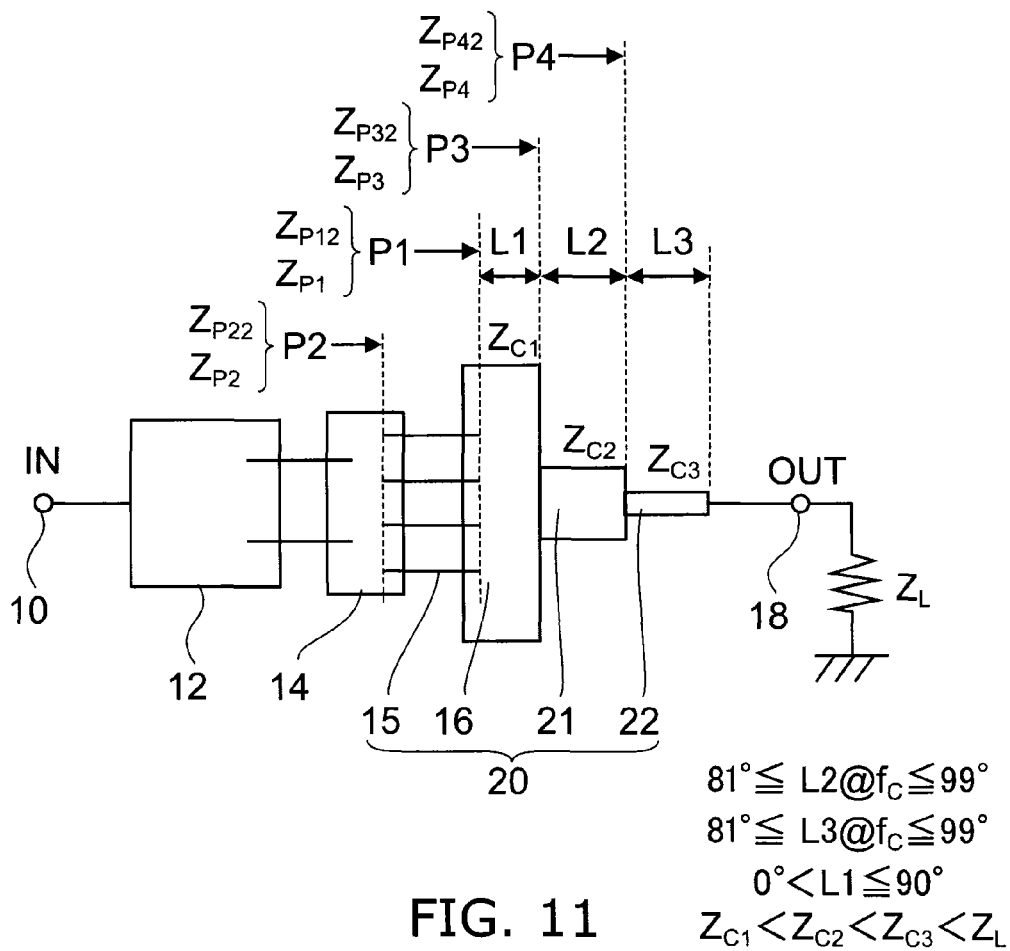
FIG. 11 is a schematic view showing the configuration of a microwave semiconductor amplifier according to a fifth embodiment.

FIG. 11 is a schematic view showing the configuration of a microwave semiconductor amplifier according to a fifth embodiment.

The output matching circuit 20 of the microwave semiconductor amplifier according to the fifth embodiment further includes a third impedance converting circuit 22 cascaded to the second transmission line 21 of the fourth embodiment. The third impedance converting circuit 22 has a third characteristic impedance $Z_{C3}$ higher than the second characteristic impedance $Z_{C2}$ and an electrical length L3 of a quarter-wave impedance transformer at the center frequency $f_C$ of a prescribed frequency band. The third impedance converting circuit 22 is made of a third transmission line.

It is assumed that the characteristic impedances are such that $Z_{C1}<Z_{C2}<Z_{C3}<Z_L$. The electrical length L3 is set to 81 degrees or more and 99 degrees or less at the center frequency $f_C$. Thus, the third impedance converting circuit 22 acts as a quarter-wave transformer.

Figure 12A:
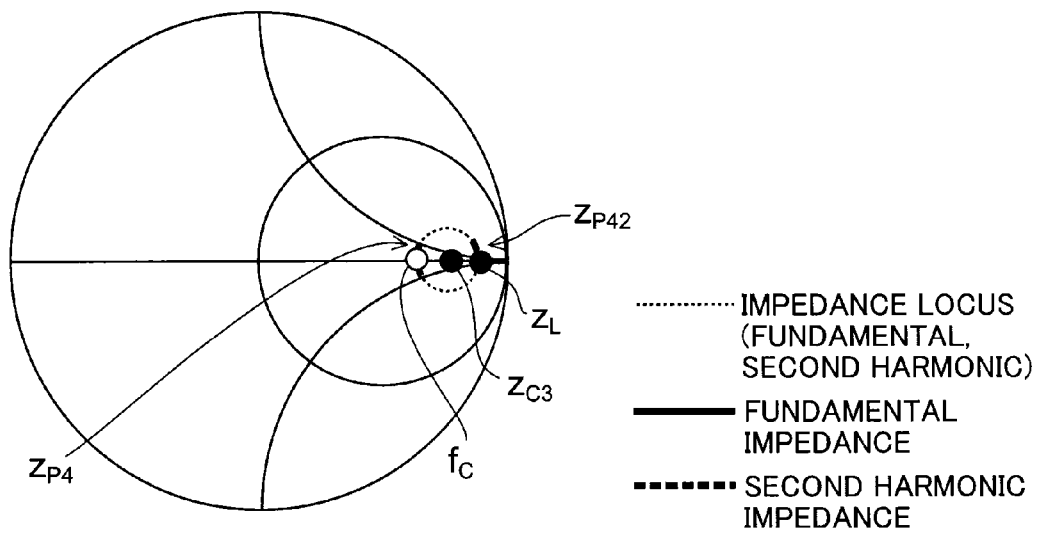
FIG. 12A is an impedance diagram seen from the fourth reference plane toward the load and FIG. 12B is an impedance diagram seen from the third reference plane toward the load.
Figure 12B:
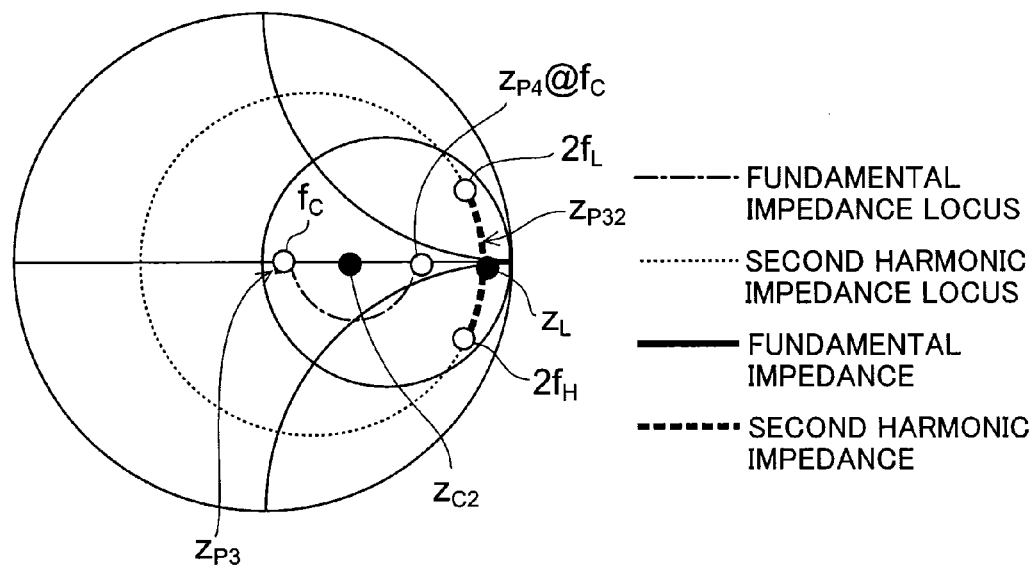

FIG. 12A is an impedance diagram seen from the fourth reference plane toward the load. FIG. 12B is an impedance diagram seen from the third reference plane toward the load.

In FIG. 12A, at the center frequency $f_C$, the fundamental impedance $Z_{P4}$ seen from the fourth reference plane P4 toward the load generally consists of the resistance component, and its value $r_{P4}$ is represented by the following equation.

$$r_{P4}=z_{C3}^2/z_L$$

In FIG. 12B, the second impedance converting circuit 21 acts as a quarter-wave transformer. As a result, at the center frequency $f_C$, the fundamental impedance $z_{P3}$ seen from the third reference plane P3 toward the load generally consists of the resistance component, and its value $r_{P3}$ is represented by the following equation.

$$r_{P3}=z_{C2}^2/z_{P4}$$

In FIG. 12B, the fundamental impedance $z_{P3}$ seen from the third reference plane P3 toward the load is generally a resistance, and can be set near the center of the impedance diagram. On the other hand, the second harmonic impedance $z_{P32}$ is capacitive at twice the upper limit frequency of the frequency band.

Figure 13A:
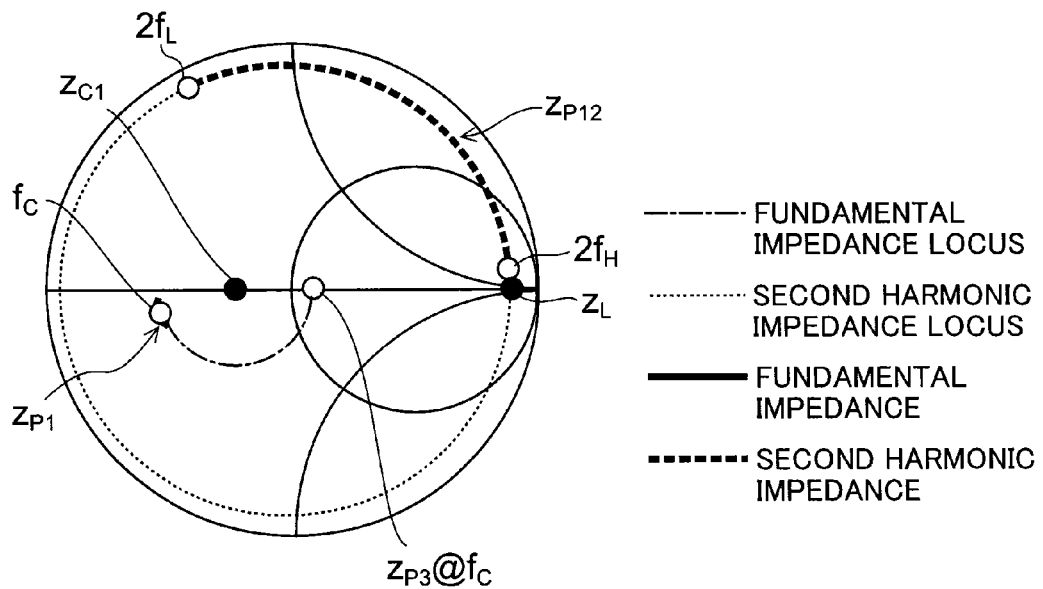
FIG. 13A is an impedance diagram seen from the first reference plane toward the load and FIG. 13B is an impedance diagram seen from the second reference plane toward the load.
Figure 13B:
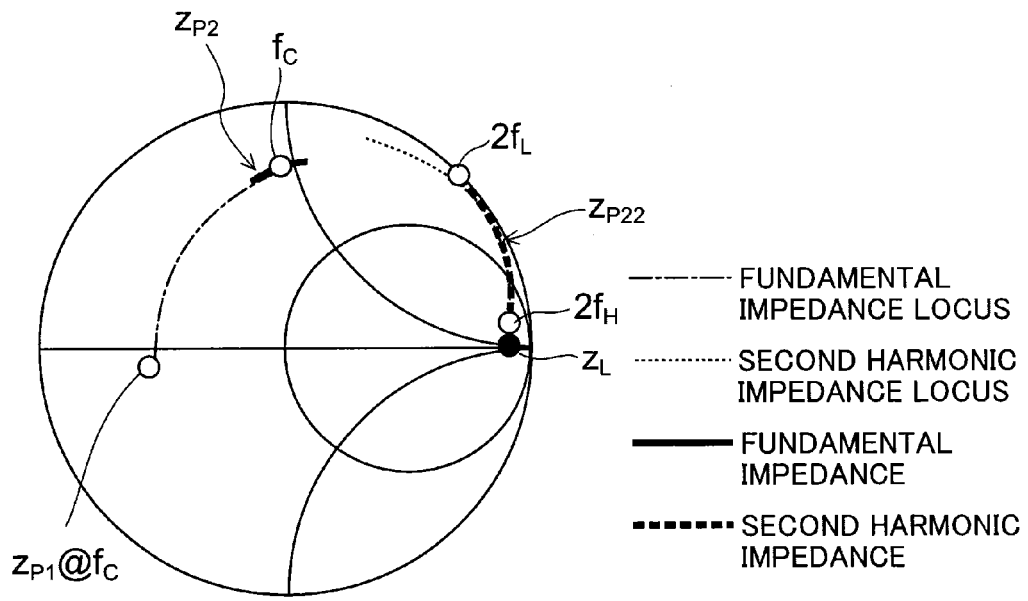

FIG. 13A is an impedance diagram seen from the first reference plane toward the load. FIG. 13B is an impedance diagram seen from the second reference plane toward the load.

The electrical length L1 of the first impedance converting circuit 16 is set to 90° or less. Thus, in FIG. 13A, at twice the upper limit frequency $f_H$, the second harmonic impedance $z_{P12}$ seen from the first reference plane P1 is inductive, and does not become capacitive.

FIG. 13B shows an impedance with the inductive impedance of the bonding wire 15 further added thereto. The impedance $z_{P2}$ seen from the second reference plane P2 toward the load has small variation, and can ensure a wide bandwidth. The second harmonic impedance $z_{P12}$ seen from the first reference plane P1 is kept inductive. Thus, by addition of the inductive reactance of the bonding wire 15, the second harmonic impedance $Z_{P22}$ is made closer to the open-circuit impedance. Accordingly, the second harmonic can be confined in the semiconductor element 14 to increase the power added efficiency. Also in the fifth embodiment, the electrical length L1 at the upper limit frequency $f_H$ of the transmission line constituting the first impedance converting circuit 16 is preferably set to 22 degrees or more.

Figure 14:
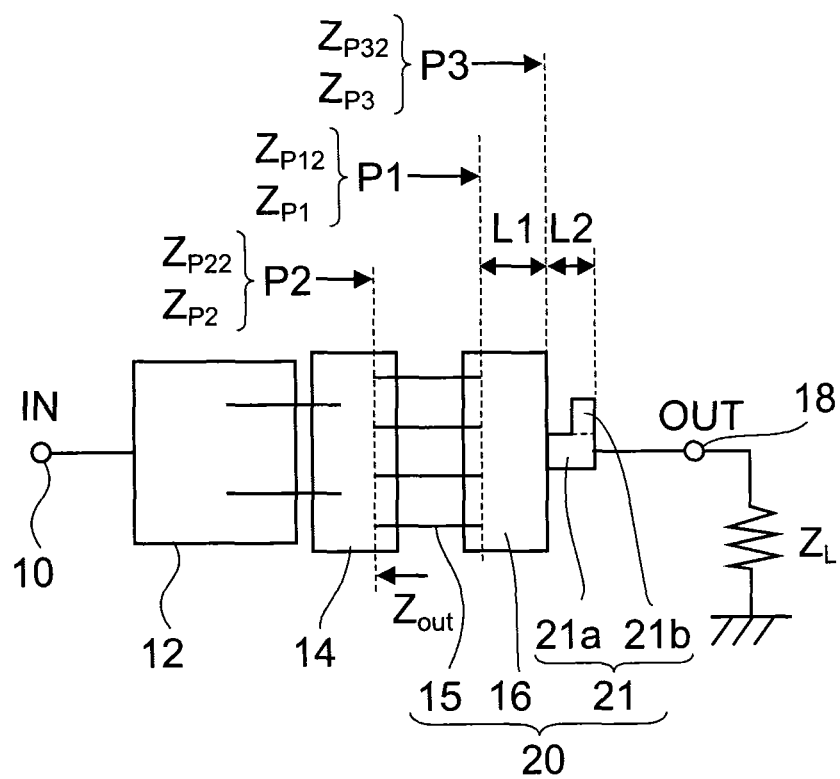
FIG. 14 is a schematic view showing the configuration of a microwave semiconductor amplifier according to a sixth embodiment.

FIG. 14 is a schematic view showing the configuration of a microwave semiconductor amplifier according to a sixth embodiment.

The second impedance converting circuit 21 of the output matching circuit 20 includes a second transmission line 21a and a stub 21b. The second transmission line 21a has a characteristic impedance $Z_{C2}$ and an electrical length L2 near 60 degrees at the center frequency $f_C$. In the specification, an electrical length near 60 degrees means 54 degrees or more and 66 degrees or less. The characteristic impedance $Z_{C2}$ is higher than the characteristic impedance $Z_{C1}$ and lower than the load impedance $Z_L$.

The output electrode of the semiconductor amplifying element 14 is connected to the first impedance converting circuit 16 by the bonding wire 15. The second reference plane P2 for seeing the impedance toward the load is defined as the bonding position on the output electrode of the semiconductor amplifying element 14.

Figure 15A:
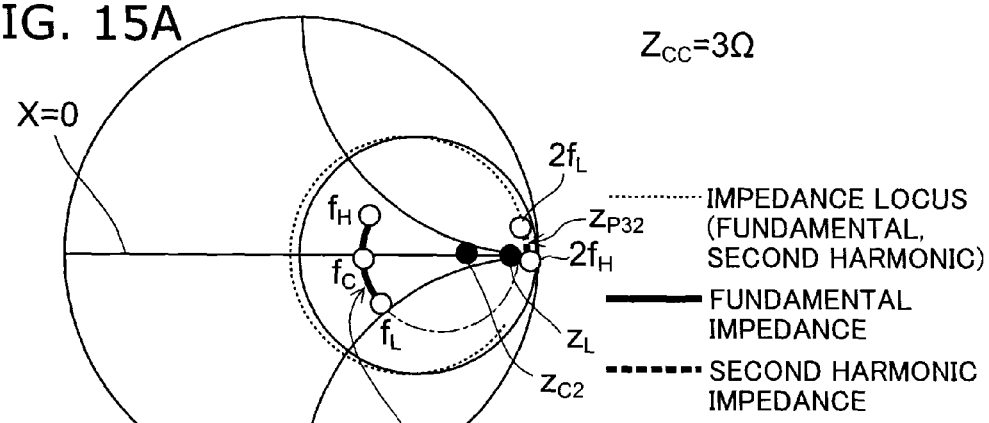
FIG. 15A is an impedance diagram seen from the third reference plane toward the load.
Figure 15B:
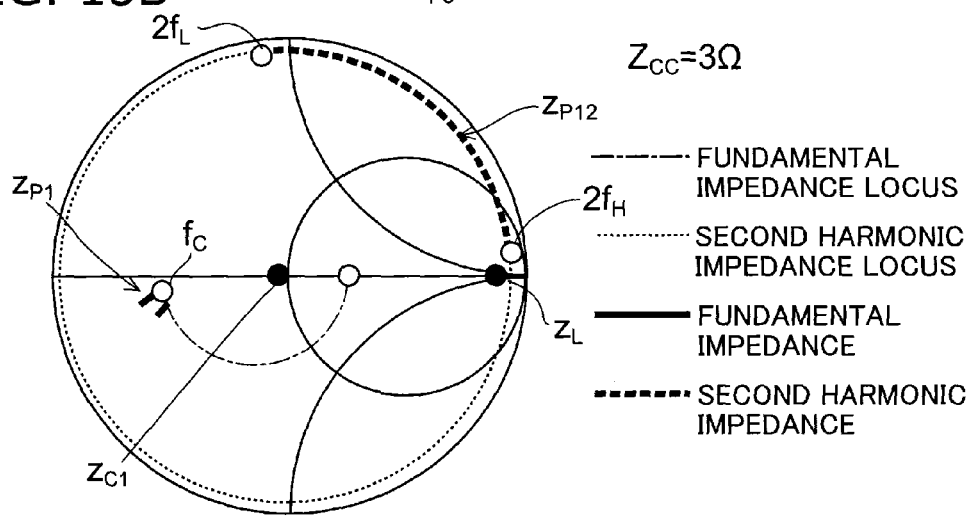
FIG. 15B is an impedance diagram seen from the first reference plane toward the load and FIG. 15C is an impedance diagram seen from the second reference plane toward the load.
Figure 15C:
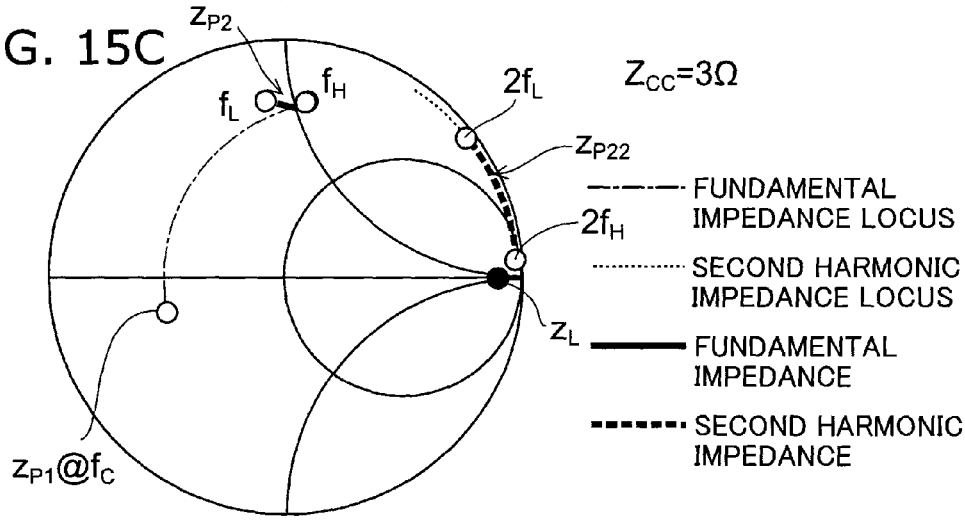

FIG. 15A is an impedance diagram seen from the third reference plane P3 toward the load. FIG. 15B is an impedance diagram seen from the first reference plane toward the load. FIG. 15C is an impedance diagram seen from the second reference plane toward the load.

As shown in FIG. 15A, on the impedance diagram, the load impedance is denoted by $z_L$, and the characteristic impedance of the first impedance converting circuit 16 is denoted by $z_{C1}$.

The fundamental impedance $z_{P3}$ seen from the third reference plane P3 toward the load draws a clockwise locus along the dot-dashed line, and is converted to a low impedance. On the other hand, the second harmonic impedance $Z_{P32}$ draws a clockwise locus along the dotted line, and returns to nearly the original impedance.

FIG. 15B shows an impedance seen from the first reference plane P1 toward the load. The first reference plane P1 is a connecting position between the first impedance converting circuit 16 and the bonding wire 15. The fundamental impedance $z_{P3}$ at the third reference plane P3 is converted by the first impedance converting circuit 16 into $z_{P1}$ at the first reference plane P1. For instance, the fundamental impedance $z_{P1}$ at the center frequency $f_C$ moves as shown in FIG. 15B. On the other hand, the second harmonic impedance $z_{P12}$ exhibits an inductive impedance near the outer periphery of the impedance diagram.

FIG. 15C shows an impedance seen from the second reference plane P2 toward the load with the inductive reactance of the bonding wire 15 added thereto. The fundamental impedance $z_{P2}$ at frequency f is the sum of the impedance $z_{P1}$ seen from the first reference plane P1 toward the load and a reactance of $2\pi f \times Lw/Z_{CC}$ resulting from the inductance Lw of the bonding wire 15. The second harmonic impedance $z_{P22}$ is the sum of $z_{P12}$ seen from the first reference plane P1 toward the load and a reactance of $4\pi f \times Lw/Z_{CC}$.

The fundamental impedance $z_{P2}$ has small variation in the band and exhibits a wide bandwidth. On the other hand, in the second harmonic impedance $z_{P22}$, an inductive impedance is added to the second harmonic impedance $z_{P12}$ kept inductive at the first reference plane P1. Thus, the second harmonic impedance $z_{P22}$ is made closer to the open-circuit impedance while being maintained to be inductive. Accordingly, the second harmonic can be confined in the semiconductor amplifying element 14 to increase the power added efficiency.

FIGS. 16A to 16C are impedance diagrams seen from the third reference plane toward the load in the case of varying the characteristic impedance of the first impedance converting circuit 16 and its electrical length. More specifically, FIG. 16A is an impedance diagram in the first case. FIG. 16B is an impedance diagram in the second case. FIG. 16C is an impedance diagram in the third case.

In the first case of FIG. 16A, the first characteristic impedance $Z_{C1}$ of the transmission line of the first impedance converting circuit 16 is set to 2.2Ω, and the first electrical length L1 is set to 90 degrees at the upper limit frequency $f_H$. In the second case of FIG. 16B, the first characteristic impedance $Z_{C1}$ of the transmission line of the first impedance converting circuit 16 is set to 1.0Ω, and the first electrical length L1 is set to 27 degrees at the upper limit frequency $f_H$. In the third case of FIG. 16C, the first characteristic impedance $Z_{C1}$ of the transmission line of the first impedance converting circuit 16 is set to 0.7Ω, and the first electrical length L1 is set to 16 degrees at the upper limit frequency $f_H$. The second impedance converting circuit 21 is common to all these cases. The characteristic impedance $Z_{C2}$ of its transmission line 21a is set to 18Ω, and the second electrical length L2 is set to 60 degrees at the center frequency $f_C$. It is assumed that the second impedance converting circuit 21 further includes a stub 21b.

In FIG. 16A, the fundamental impedance $z_{P3}$ draws a locus along the dot-dashed line, and is converted to a low impedance. On the other hand, the second harmonic impedance $Z_{P32}$ draws a locus along the dotted line, and returns to nearly the original impedance.

Figure 17A:
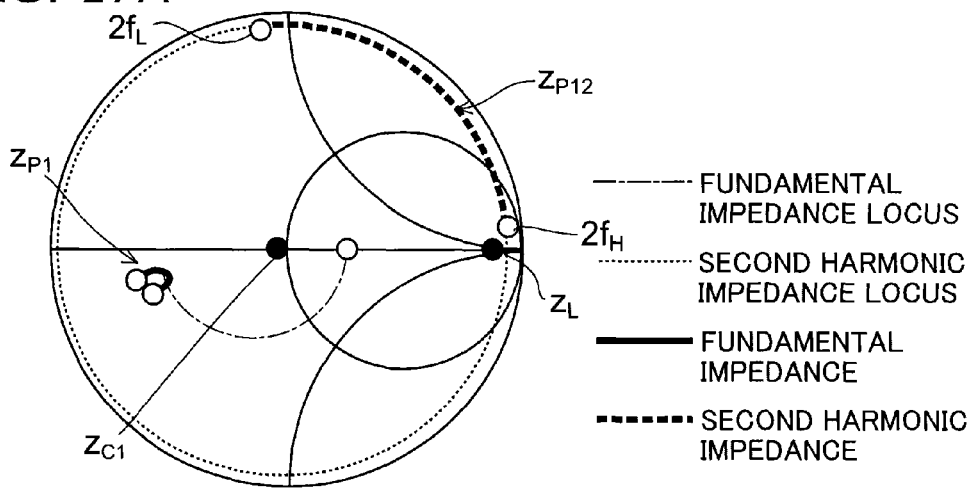
FIG. 17A is an impedance diagram in the first case.
Figure 17B:
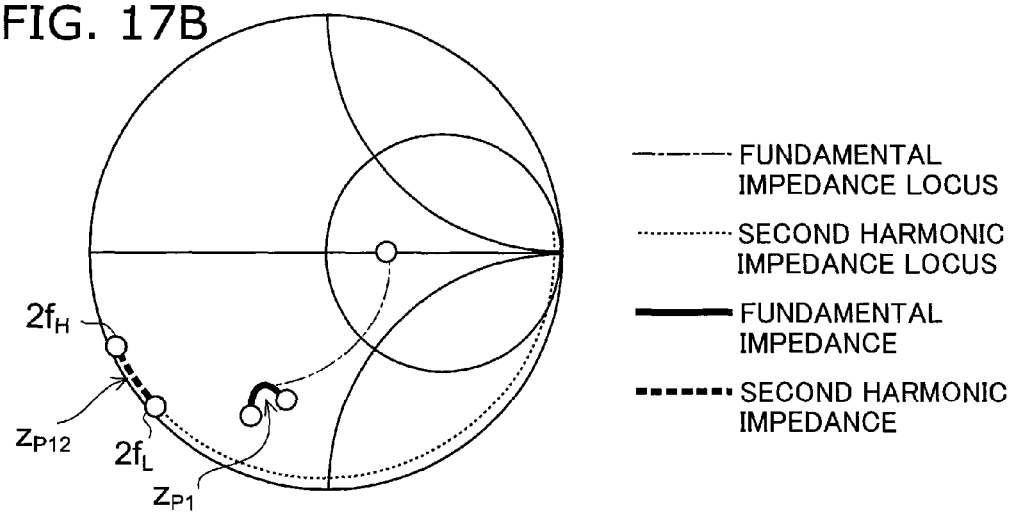
FIG. 17B is an impedance diagram in the second case and FIG. 17C is an impedance diagram in the third case.
Figure 17C:
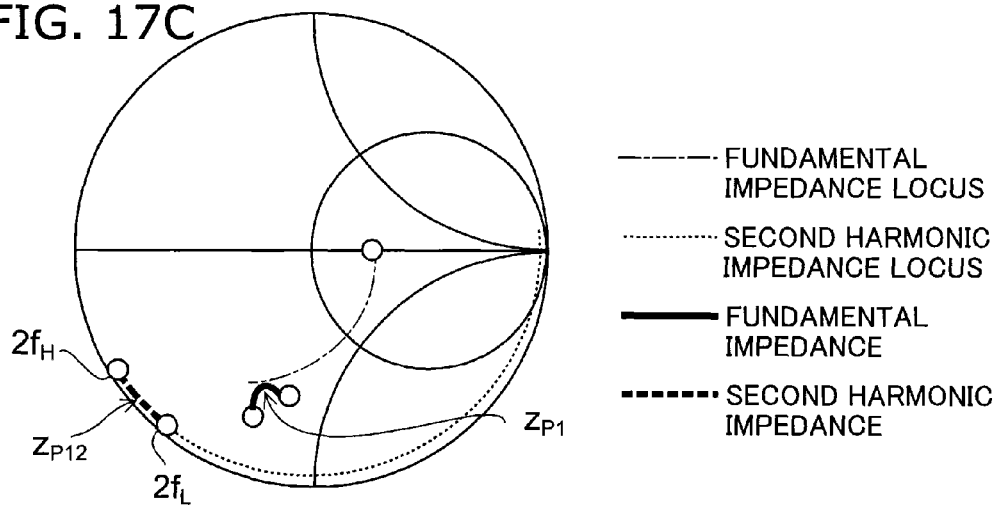

FIGS. 17A to 17C are impedance diagrams seen from the first reference plane toward the load. More specifically, FIG. 17A is an impedance diagram in the first case. FIG. 17B is an impedance diagram in the second case. FIG. 17C is an impedance diagram in the third case.

FIGS. 18A to 18C are impedance diagrams seen from the second reference plane toward the load. More specifically, FIG. 18A is an impedance diagram in the first case. FIG. 18B is an impedance diagram in the second case. FIG. 18C is an impedance diagram in the third case.

For matching of the fundamental using the inductance Lw of the bonding wire 15, the impedance $z_{P1}$ at the first reference plane P1 is preferably located on the constant resistance circle g1, g2, g3 for the complex conjugate of the output impedance $z_{out}$ of the semiconductor amplifying element 14. TABLE 3 lists these results.

TABLE 3

| | L, $Z_C$, Γ | | | | |
|---|---|---|---|---|---|
| CASE | L2@$f_C$ | $Z_{C2}$ | L1@$f_H$ | $Z_{C1}$ | Γ for 2f @P2 |
| $1^{st}$ | 60° + stub | 18Ω | 90° | 2.2Ω | 0.97 or more |
| $2^{nd}$ | 60° + stub | 18Ω | 27° | 1.0Ω | 0.99 or more |
| $3^{rd}$ | 60° + stub | 18Ω | 16° | 0.7Ω | 0.99 or more |

In the case where the first electrical length L1 of the first impedance converting circuit 16 is decreased, matching can be achieved at the fundamental by decreasing the characteristic impedance $Z_{C1}$ of the first impedance converting circuit 16 and increasing the inductance Lw of the bonding wire 15. By increasing the inductance Lw, the reflection coefficient Γ for the second harmonic (2f) at the second reference plane P2 can be increased to 0.99 or more. However, there is a lower limit to the feasible characteristic impedance.

The lower limit of the characteristic impedance is 1Ω from TABLE 3. In this case, more preferably, the first electrical length L1 of the first impedance converting circuit 16 is set to 27 degrees or more. Then, the reflection coefficient Γ at the second reference plane P2 of the semiconductor amplifying element 14 can be set to 0.97 or more. Thus, the impedance for the second harmonic can be sufficiently increased.

Figure 19:
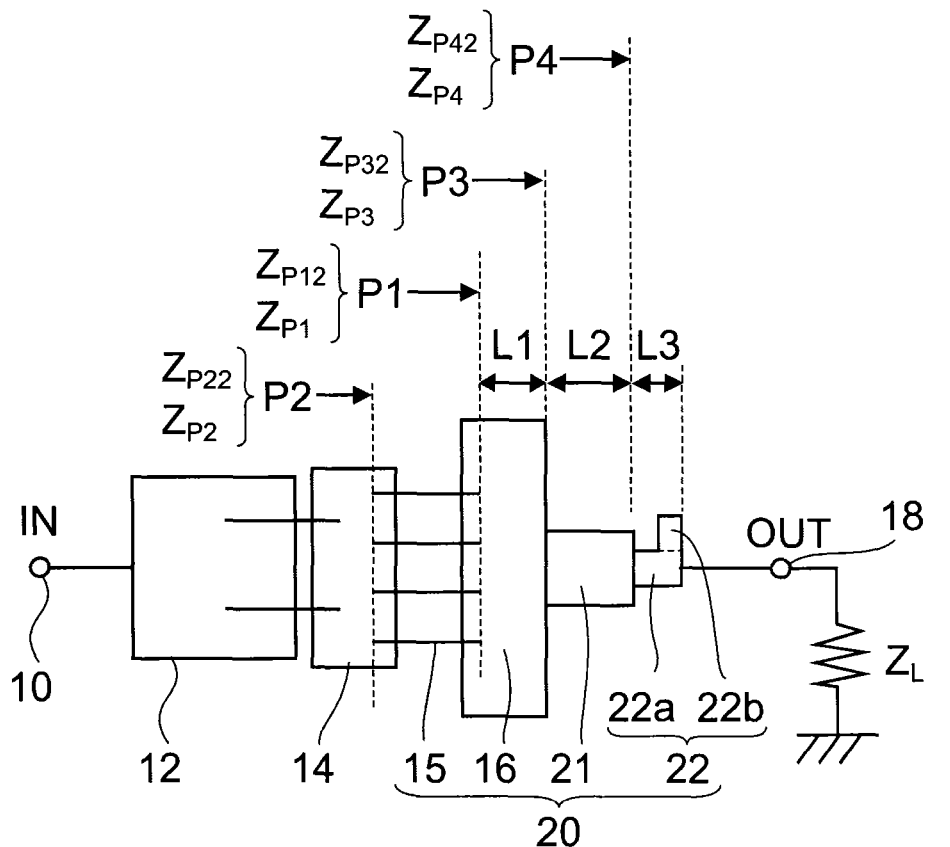
FIG. 19 is a schematic view showing the configuration of a microwave semiconductor amplifier according to a seventh embodiment.

FIG. 19 is a schematic view showing the configuration of a microwave semiconductor amplifier according to a seventh embodiment.

The output matching circuit 20 of the microwave semiconductor amplifier according to the seventh embodiment further includes a third impedance converting circuit 22 cascaded to the second impedance converting circuit 21 and made of a third transmission line.

It is assumed that the second impedance converting circuit 21 is made of a second transmission line having a characteristic impedance $Z_{C2}$ and a second electrical length L2. The third impedance converting circuit 22 includes a transmission line 22a having a characteristic impedance $Z_{C3}$ and a third electrical length L3, and a stub 22b connected to the transmission line 22a. The second electrical length L2 of the second impedance converting circuit 21 and the third electrical length L3 of the transmission line 22a of the third impedance converting circuit 22 are set to a length corresponding to a quarter-wave transformer at the center frequency $f_C$. Furthermore, it is assumed that $Z_{C1} < Z_{C2} < Z_{C3} < Z_L$.

Figure 20A:
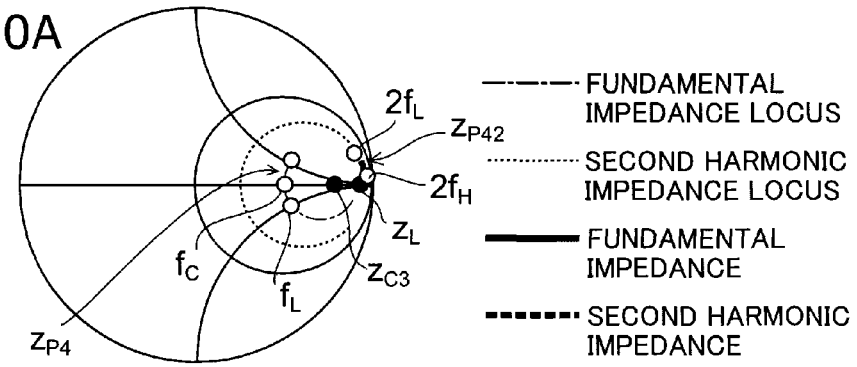
FIG. 20A is an impedance diagram seen from the fourth reference plane toward the load.
Figure 20B:
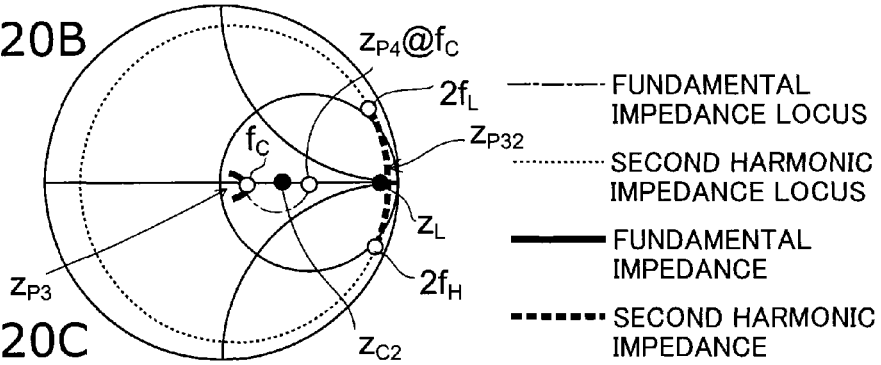
FIG. 20B is an impedance diagram seen from the third reference plane toward the load.
Figure 20C:
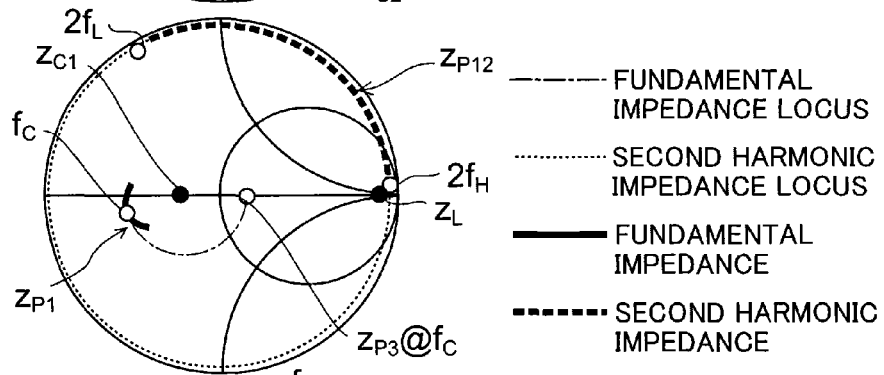
FIG. 20C is an impedance diagram seen from the first reference plane toward the load and FIG. 20D is an impedance diagram seen from the second reference plane toward the load.
Figure 20D:
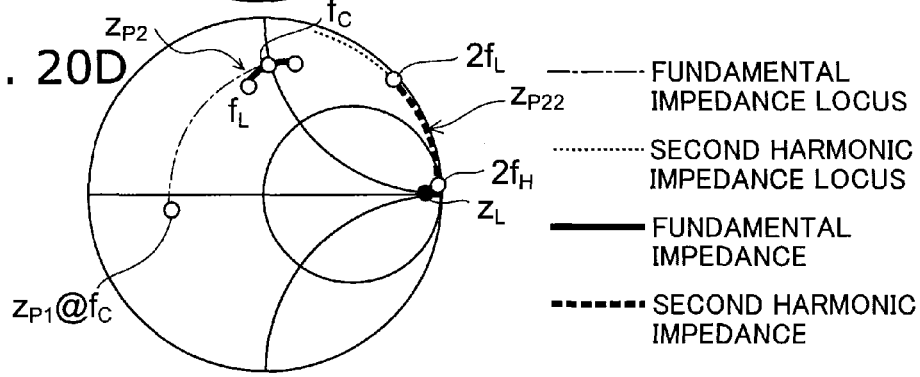

FIG. 20A is an impedance diagram seen from the fourth reference plane toward the load. FIG. 20B is an impedance diagram seen from the third reference plane toward the load. FIG. 20C is an impedance diagram seen from the first reference plane toward the load. FIG. 20D is an impedance diagram seen from the second reference plane toward the load.

As shown in FIG. 20A, the fundamental impedance $Z_{P4}$ seen from the fourth reference plane P4 toward the load is converted by the third impedance converting circuit 22.

As shown in FIG. 20B, the second impedance converting circuit 21 acts as a quarter-wave transformer to perform impedance conversion. For instance, in the case where $Z_{P4}$ can be regarded as a resistance, the impedance $z_{P3}$ converted by the quarter-wave transformer becomes a resistance and can be represented by the following equation.

$$z_{P3} = z_{C2}^2 / z_{P4}$$

FIG. 20C shows a fundamental impedance $Z_{P1}$ seen from the first reference plane P1 toward the load. The second harmonic impedance $z_{P12}$ seen from the first reference plane P1 toward the load is inductive.

FIG. 20D shows a fundamental impedance $Z_{P2}$ and a second harmonic impedance $z_{P22}$ seen from the second reference plane P2 toward the load with the reactance resulting from the inductance Lw of the bonding wire 15 added thereto. The second harmonic impedance seen from the first reference plane P1 is kept inductive. Thus, by addition of the inductive reactance of the bonding wire 15, the second harmonic impedance $Z_{P22}$ seen from the second reference plane P2 toward the load is made closer to the open-circuit impedance. Accordingly, the second harmonic can be confined in the semiconductor amplifying element 14 to increase the power added efficiency. Also in the seventh embodiment, the electrical length L1 at the upper limit frequency $f_H$ of the transmission line constituting the first impedance converting circuit 16 is preferably set to 27 degrees or more.

In general, in a class F amplifier, a higher harmonic processing circuit cascaded with a matching circuit is provided on the output side near the semiconductor amplifying element. Thus, by confining higher harmonic components in the semiconductor amplifying element, the power added efficiency is increased.

In contrast, in the first to seventh embodiments, the higher harmonic processing circuit is not used. Instead, an impedance converting circuit made of a transmission line is connected on the output side of the semiconductor amplifying element 14. In this case, by separately varying the characteristic impedance and electrical length of the transmission line, the fundamental impedance and the second harmonic impedance can be separately converted to a desired range. Thus, while keeping the second harmonic impedance at the open-circuit impedance, the fundamental impedance can be matched with the output impedance $z_{out}$ of the semiconductor amplifying element 14. As a result, despite its simple structure, the microwave semiconductor amplifier can sufficiently ensure the required power added efficiency.

The first to seventh embodiments provide a microwave semiconductor amplifier capable of achieving high power added efficiency and wide bandwidth. Such a microwave semiconductor amplifier can be widely used in radio communication devices, mobile communication base stations, radar devices and the like at radio frequencies of 1 GHz or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A microwave semiconductor amplifier with an output terminal connected to an external load, the amplifier having a prescribed frequency band, comprising:
   a semiconductor amplifying element including an input electrode and an output electrode and having a capacitive output impedance in the frequency band;
   an input matching circuit connected to the input electrode; and
   an output matching circuit including a bonding wire and a first transmission line, the bonding wire including a first end portion and a second end portion on an opposite side of the first end portion, the first end portion being connected to the output electrode, the second end portion being connected to one end portion of the first transmission line, a fundamental impedance and a second harmonic impedance seen toward the external load changing toward the one end portion of the first transmission line, the second harmonic impedance at the one end portion of the first transmission line having an inductive reactance within a frequency range of double a lower limit frequency of the frequency band to double an upper limit frequency of the frequency band, the output matching circuit matching the capacitive output impedance of the semiconductor amplifying element to the fundamental impedance of the external load.

2. The amplifier according to claim 1, wherein the first transmission line has a first characteristic impedance and a first electrical length of 90 degrees or less at the upper limit frequency of the frequency band.

3. The amplifier according to claim 2, wherein
the output matching circuit further includes a second transmission line having a second characteristic impedance higher than the first characteristic impedance and a second electrical length of 90 degrees or less at the upper limit frequency, and
the second transmission line is provided between the first transmission line and the output terminal.

4. The amplifier according to claim 3, wherein the second electrical length is 60 degrees or more at the lower limit frequency of the frequency band.

5. The amplifier according to claim 3, wherein
the output matching circuit further includes a third transmission line having a third characteristic impedance higher than the second characteristic impedance and a third electrical length of 90 degrees or less at the upper limit frequency, and
the third transmission line is provided between the second transmission line and the output terminal.

6. The amplifier according to claim 5, wherein the third electrical length is 60 degrees or more at the lower limit frequency of the frequency band.

7. The amplifier according to claim 1, wherein the first transmission line has a first characteristic impedance, the output matching circuit further includes a second transmission line having a second characteristic impedance higher than the first characteristic impedance, cascaded to the first transmission line, and having a second electrical length acting as a quarter-wave transformer at a center frequency of the frequency band.

8. The amplifier according to claim 7, wherein the first transmission line has a first electrical length of 90 degrees or less at the upper limit frequency of the frequency band.

9. The amplifier according to claim 8, wherein the output matching circuit further includes a third transmission line cascaded to the second transmission line and having a third characteristic impedance higher than the second characteristic impedance and a third electrical length acting as a quarter-wave transformer at the center frequency of the frequency band.

10. The amplifier according to claim 8, wherein the first electrical length is 22 degrees or more at the upper limit frequency.

11. The amplifier according to claim 9, wherein the first electrical length is 22 degrees or more at the upper limit frequency.

12. The amplifier according to claim 1, wherein the output matching circuit further includes a second transmission line cascaded to the first transmission line and a stub cascaded to the second transmission line, and matches the capacitive output impedance of the semiconductor amplifying element to the fundamental impedance of the external load.

13. The amplifier according to claim 12, wherein
the first transmission line has a first characteristic impedance and a first electrical length of 90 degrees or less at the upper limit frequency of the frequency band, and
the second transmission line has a second characteristic impedance higher than the first characteristic impedance and an electrical length of 51 degrees or more and 69 degrees or less at a center frequency of the frequency band.

14. The amplifier according to claim 13, wherein
the first characteristic impedance is 1$\Omega$ or more, and
the first electrical length is 27 degrees or more at the upper limit frequency of the frequency band.

15. The amplifier according to claim 1, wherein the output matching circuit further includes a second transmission line cascaded to the first transmission line, a third transmission line cascaded to the second transmission line, and a stub connected to the third transmission line, and matches the capacitive output impedance of the semiconductor amplifying element to the fundamental impedance of the external load.

16. The amplifier according to claim 15, wherein the first transmission line has a first characteristic impedance and an first electrical length of 90 degrees or less at the upper limit frequency of the frequency band,
the second transmission line has a second characteristic impedance higher than the first characteristic impedance and an second electrical length acting as a quarter-wave transformer at a center frequency of the frequency band, and
the third transmission line has a third characteristic impedance higher than the second characteristic impedance and an electrical length acting as a quarter-wave transformer at the center frequency of the frequency band.

17. The amplifier according to claim 16, wherein
the first characteristic impedance is 1$\Omega$ or more, and
the first electrical length is 27 degrees or more at the upper limit frequency of the frequency band.

* * * * *